US012375833B2

(12) United States Patent
Oishi

(10) Patent No.: US 12,375,833 B2
(45) Date of Patent: Jul. 29, 2025

(54) SOLID-STATE IMAGING DEVICE

(71) Applicant: SONY SEMICONDUCTOR SOLUTIONS CORPORATION, Kanagawa (JP)

(72) Inventor: Hidetoshi Oishi, Saga (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 322 days.

(21) Appl. No.: 18/000,421

(22) PCT Filed: Apr. 21, 2021

(86) PCT No.: PCT/JP2021/016182
§ 371 (c)(1),
(2) Date: May 5, 2023

(87) PCT Pub. No.: WO2021/251009
PCT Pub. Date: Dec. 16, 2021

(65) Prior Publication Data
US 2023/0269503 A1 Aug. 24, 2023

(30) Foreign Application Priority Data
Jun. 9, 2020 (JP) .................. 2020-100154

(51) Int. Cl.
*H04N 25/772* (2023.01)
*H04N 25/767* (2023.01)
(Continued)

(52) U.S. Cl.
CPC ......... *H04N 25/772* (2023.01); *H04N 25/767* (2023.01); *H10F 39/182* (2025.01);
(Continued)

(58) Field of Classification Search
CPC .................................................. H04N 25/772
See application file for complete search history.

(56) References Cited

U.S. PATENT DOCUMENTS 10,347,673 B2 * 7/2019 Otake ................. H10D 64/517
11,683,601 B2 * 6/2023 Kato ..................... H04N 25/618
348/302
(Continued)

FOREIGN PATENT DOCUMENTS

JP 2006-179848 7/2006
JP 2010-245506 10/2010
(Continued)

OTHER PUBLICATIONS

International Search Report and Written Opinion prepared by the Japan Patent Office on Jul. 15, 2021, for International Application No. PCT/JP2021/016182, 2 pgs.

*Primary Examiner* — Cynthia Segura
(74) *Attorney, Agent, or Firm* — Sheridan Ross PC

(57) ABSTRACT

The disclosed device reduces noise while suppressing an increase in layout area of transistors included in a readout circuit. This solid-state imaging device includes: a first substrate section; a second substrate section disposed on one side of the first substrate section; a readout circuit; and first and second transistor cells each having, for each readout circuit, a plurality of transistors included in the readout circuit, the first and second transistor cells being arranged adjacent to each other. In addition, the plurality of transistors includes amplification transistors, a sensor pixel is provided on the first substrate section, the readout circuit and the first and second transistor cells are provided on the second substrate section, the amplification transistors of the first and second transistor cells are arranged adjacent to each other, and a first main electrode region of a pair of main electrode regions of each of the amplification transistors is shared.

19 Claims, 24 Drawing Sheets

(51) Int. Cl.
  *H10F 39/00* (2025.01)
  *H10F 39/18* (2025.01)

(52) U.S. Cl.
  CPC ....... *H10F 39/8037* (2025.01); *H10F 39/807* (2025.01); *H10F 39/811* (2025.01); *H10F 39/813* (2025.01)

(56) References Cited

U.S. PATENT DOCUMENTS

| | | | |
|---|---|---|---|
| 2011/0080493 A1* | 4/2011 | Kono | H10F 39/813 348/222.1 |
| 2012/0224089 A1 | 9/2012 | Sato | |
| 2015/0179691 A1 | 6/2015 | Yanagita et al. | |
| 2017/0201705 A1 | 7/2017 | Ishiwata | |
| 2022/0238577 A1* | 7/2022 | Basavalingappa | H10F 39/8037 |

FOREIGN PATENT DOCUMENTS

| | | |
|---|---|---|
| JP | 2012-186540 | 9/2012 |
| JP | 2013-062789 | 4/2013 |
| JP | 2014-022561 | 2/2014 |
| JP | 2016-005068 | 1/2016 |

\* cited by examiner

SOLID-STATE IMAGING DEVICE

CROSS REFERENCE TO RELATED APPLICATIONS

This application is a national stage application under 35 U.S.C. 371 and claims the benefit of PCT Application No. PCT/JP2021/016182, having an international filing date of 21 Apr. 2021, which designated the United States, which PCT application claimed the benefit of Japanese Patent Application No. 2020-100154, filed 9 Jun. 2020, the entire disclosures of each of which are incorporated herein by reference.

TECHNICAL FIELD

The present technology (technology according to the present disclosure) relates to a solid-state imaging device.

BACKGROUND ART

In a solid-state imaging device, it is important to improve the efficiency of the layout area of pixel transistors for scaling sensor pixels.

Patent Document 1 discloses a technique for reducing the layout area of transistors by sharing a diffusion layer between pixels adjacent to each other.

Patent Document 2 discloses a technique for improving the efficiency of the layout area of transistors by stacking a sensor pixel that performs photoelectric conversion and a readout circuit that outputs a pixel signal based on an electric charge output from the sensor pixel using different semiconductor layers.

Meanwhile, Patent Document 3 reports that an arrangement position of a pixel transistor affects optical characteristics of a sensor pixel. Specifically, Patent Document 3 indicates that, in a case where pixel transistors are disposed asymmetrically in a common pixel unit, a difference in sensitivity may occur between a plurality of photoelectric conversion units.

CITATION LIST

Patent Document

Patent Document 1: Japanese Patent Application Laid-Open No. 2012-186540
Patent Document 2: Japanese Patent Application Laid-Open No. 2010-245506
Patent Document 3: Japanese Patent Application Laid-Open No. 2013-062789

SUMMARY OF THE INVENTION

Problems to be Solved by the Invention

Meanwhile, in a solid-state imaging device, noise reduction is one of important parameters. One method of reducing noise is to increase the gate area (gate length Lg×gate width Wg) of an amplification transistor included in a readout circuit.

However, in the structure in Patent Document 1, when the gate area of the amplification transistor is increased in order to reduce noise, a difference in sensitivity may occur between photoelectric conversion units due to a difference in transistor size between the amplification transistor and a reset transistor. Thus, it is difficult to reduce noise while suppressing an increase in the layout area of the transistors.

An object of the present technology is to provide a technology capable of reducing noise while suppressing an increase in a layout area of a plurality of transistors included in a readout circuit.

Solutions to Problems (1) A solid-state imaging device according to one aspect of the present technology includes: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view. In addition, the plurality of transistors includes amplification transistors, the sensor pixel is provided on the first substrate section, and the readout circuit and the first and second transistor cells are provided on the second substrate section. In addition, the amplification transistors of the first and second transistor cells are arranged adjacent to each other, and a first main electrode region of a pair of main electrode regions of each of the amplification transistors is shared.

(2) A solid-state imaging device according to another aspect of the present technology includes: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view. In addition, the plurality of transistors includes reset transistors, the sensor pixel is provided on the first substrate section, and the readout circuit and the first and second transistor cells are provided on the second substrate section. In addition, the reset transistors of the first and second transistor cells are arranged adjacent to each other, and a first main electrode region of a pair of main electrode regions of each of the reset transistors is shared.

(3) A solid-state imaging device according to still another aspect of the present technology includes: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view. In addition, the plurality of transistors includes amplification transistors and reset transistors, the sensor pixel is provided on the first substrate section, and the readout circuit and the first and second transistor cells are provided on the second substrate section. In addition, the amplification transistors of the first and second transistor cells are arranged adjacent to each other, and a first main electrode region of a pair of main electrode regions of each of the amplification transistors is shared.

(4) A solid-state imaging device according to still another aspect of the present technology includes: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view. In addition, the plurality of transistors includes selection transistors, the sensor pixel is provided on the first substrate section, and the readout circuit and the first and second transistor cells are provided on the second substrate section. In addition, the selection transistors of the first and second transistor cells are arranged adjacent to each other, and a gate electrode of each of the selection transistors is shared.

(5) A solid-state imaging device according to still another aspect of the present technology includes: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view. In addition, the plurality of transistors includes reset transistors, the sensor pixel is provided on the first substrate section, and the readout circuit and the first and second transistor cells are provided on the second substrate section. In addition, the reset transistors of the first and second transistor cells are arranged adjacent to each other, and a gate electrode of each of the reset transistors is shared.

MODE FOR CARRYING OUT THE INVENTION

Embodiments of the present technology will be described below with reference to the drawings. In the description of the drawings referred to in the following description, the same or similar parts are denoted by the same or similar reference signs. However, it should be noted that the drawings are schematic, and the relationship between thicknesses and plane dimensions, thickness ratio of layers, etc. are different from actual ones. Therefore, specific thicknesses and dimensions should be determined in consideration of the following description. In addition, it is obvious that the drawings include portions that are different in dimensional relationship and ratio among the drawings. In addition, it should be noted that the effects described in the present specification are merely illustrative and not restrictive, and may have additional effects.

In addition, the definitions of directions such as up and down in the following description are merely defined for convenience of description, and do not limit the technical idea of the present technology. It is obvious that, for example, when an object is rotated by 90° and observed, the vertical direction is converted and read as the horizontal direction, and when an object is rotated by 180° and observed, the top side is read as the bottom side, and the bottom side is read as the top side.

In addition, in the following embodiments, in three directions orthogonal to each other in a space, a first direction and a second direction orthogonal to each other in the same plane are defined as an X direction and a Y direction, respectively, and a third direction orthogonal to each of the first direction and the second direction is defined as a Z direction. Further, in the following embodiments, the thickness direction of a first substrate section 10 and a second substrate section 20 described later will be described as the Z direction.

First Embodiment

The first embodiment will describe an example in which the present technology is applied to a solid-state imaging device that is a back-illuminated complementary metal oxide semiconductor (CMOS) image sensor.

<<Configuration Example of Solid-State Imaging Device>>

Figure 1:
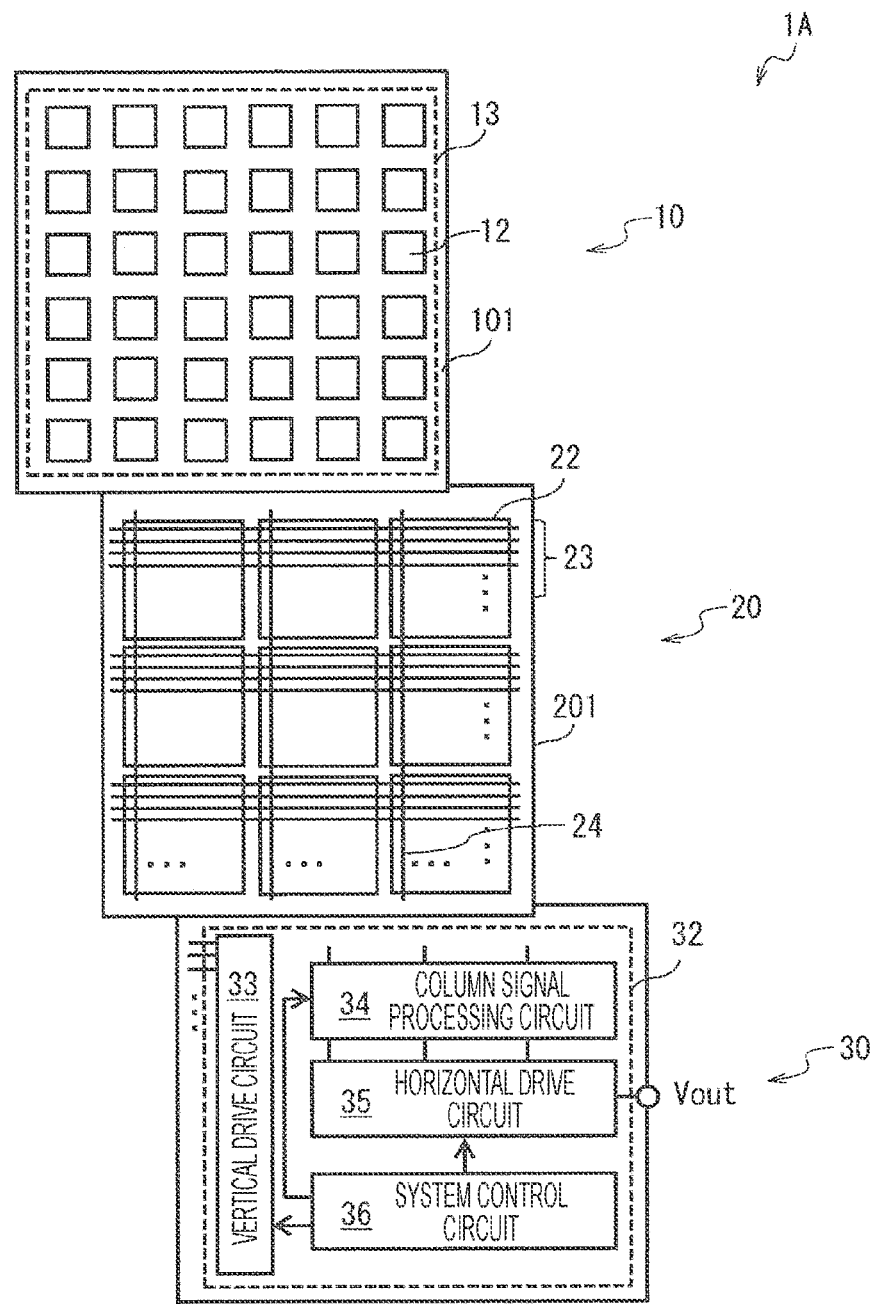
FIG. 1 is a schematic diagram schematically illustrating a solid-state imaging device according to a first embodiment of the present technology.

FIG. 1 is a schematic diagram schematically illustrating a solid-state imaging device 1A according to the first embodiment of the present technology.

As illustrated in FIG. 1, the solid-state imaging device 1A according to the first embodiment of the present technology includes a first substrate section (first floor section) 10, a second substrate section (second floor section) 20, and a third substrate section (third floor section) 30. The solid-state imaging device 1A has a three-dimensional structure in which the first substrate section 10, the second substrate section 20, and the third substrate section 30 are stacked in this order.

Figure 2:
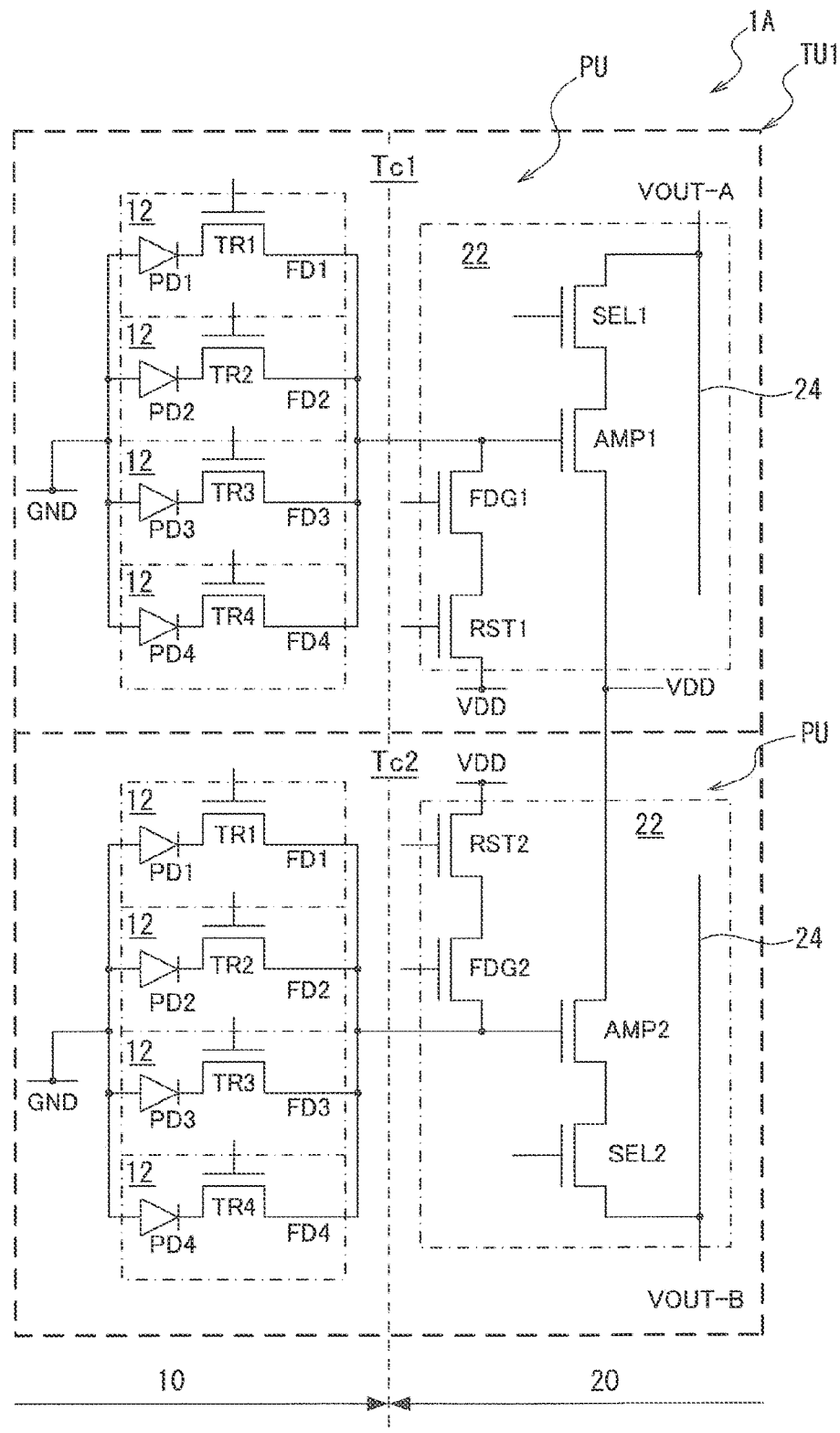
FIG. 2 is an equivalent circuit diagram illustrating a configuration example of a pixel unit mounted on the solid-state imaging device according to the first embodiment of the present technology.
Figure 3:
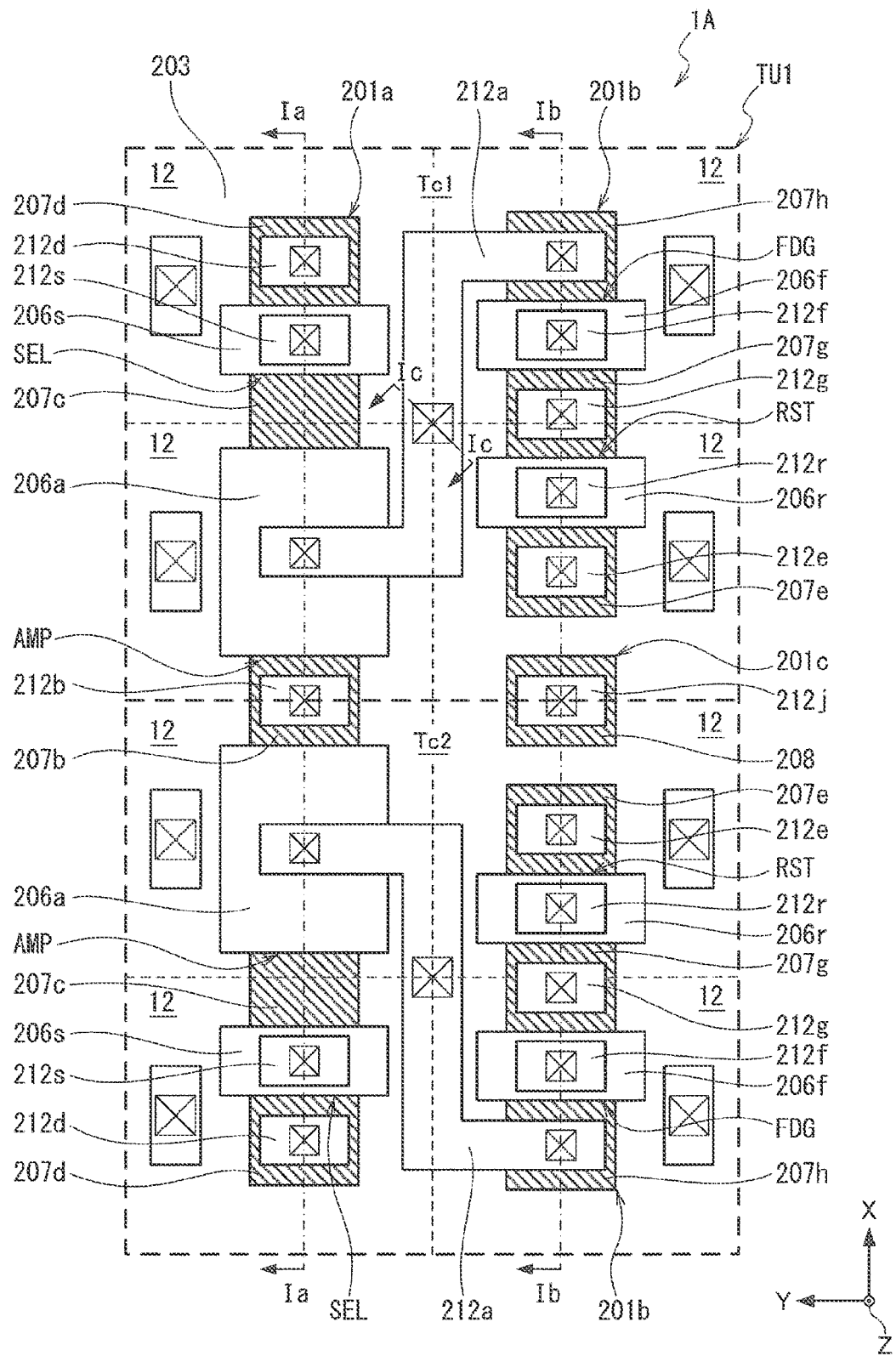
FIG. 3 is a layout plan view of a transistor cell unit mounted on the solid-state imaging device according to the first embodiment of the present technology.

In addition, the solid-state imaging device 1A according to the first embodiment of the present technology includes a pixel unit PU illustrated in FIG. 2 and a transistor cell unit TU1 illustrated in FIG. 3.

Here, each of the first substrate section 10, the second substrate section 20, and the third substrate section 30 has a first surface and a second surface located on opposite sides in the thickness direction. In the following description, the first surface may be referred to as a main surface, and the second surface may be referred to as a back surface.

In addition, among a first surface and a second surface located on opposite sides in the thickness direction of a semiconductor layer 101 to be described later, the first surface may be referred to as a main surface, and the second surface may be referred to as a back surface.

In addition, among a first surface and a second surface located on opposite sides in the thickness direction of a semiconductor layer 201 to be described later, the first surface may be referred to as a main surface, and the second surface may be referred to as a back surface.

As illustrated in FIG. 1, the first substrate section 10 includes a plurality of sensor pixels 12 that performs photoelectric conversion in the semiconductor layer 101. Each of the plurality of sensor pixels 12 is provided in a matrix in a pixel region 13 of the first substrate section 10 in plan view. The second substrate section 20 includes readout circuits 22 that output pixel signals based on electric charges output from the sensor pixels 12, each of the readout circuits 22 being provided for the four sensor pixels 12. The second substrate section 20 includes a plurality of pixel drive lines 23 extending in the row direction (X direction) and a plurality of vertical signal lines 24 extending in the column direction (Y direction). That is, in the solid-state imaging device 1A according to the first embodiment, the sensor pixels 12 are provided on the first substrate section 10, and the readout circuits 22 are provided on the second substrate section 20.

Note that the third substrate section 30 may be referred to as a bottom substrate, the second substrate section 20 may be referred to as a middle substrate, and the first substrate section 10 may be referred to as a top substrate.

The third substrate section 30 includes a logic circuit 32 that processes pixel signals. The logic circuit 32 includes, for example, a vertical drive circuit 33, a column signal processing circuit 34, a horizontal drive circuit 35, and a system control circuit 36. The logic circuit 32 (specifically, the horizontal drive circuit 35) outputs an output voltage Vout for each sensor pixel 12 to the outside. In the logic circuit 32, a low-resistance region may be formed on a surface of an impurity diffusion region (semiconductor region) that is in contact with a source electrode and a drain electrode, for example, the low-resistance region being formed with a self-aligned silicide process using, for example, $CoSi_2$ or NiSi. The logic circuit 32 includes, for example, a CMOS circuit including an n-channel conductivity type MOSFET and a p-channel conductivity type MOSFET.

The vertical drive circuit 33 sequentially selects the plurality of sensor pixels 12 row by row, for example. The column signal processing circuit 34 performs, for example, correlated double sampling (CDS) processing on the pixel signal output from each sensor pixel 12 in the row selected by the vertical drive circuit 33. The column signal processing circuit 34 extracts a signal level of a pixel signal by performing CDS processing, for example, and holds pixel data corresponding to the amount of light received by each sensor pixel 12. The horizontal drive circuit 35 sequentially outputs the pixel data held in the column signal processing circuit 34 to the outside, for example. The system control circuit 36 controls driving of each block (vertical drive circuit 33, column signal processing circuit 34, and horizontal drive circuit 35) in the logic circuit 32, for example.

<<Configuration of Pixel Unit>>

Next, a configuration of the pixel unit PU will be described with reference to FIG. 2. FIG. 2 is an equivalent circuit diagram illustrating a configuration example of the pixel unit PU mounted on the solid-state imaging device 1A according to the first embodiment of the present technology.

As illustrated in FIG. 2, in the solid-state imaging device 1A according to the first embodiment, four sensor pixels 12, for example, are electrically connected to one readout circuit 22 to constitute one pixel unit PU. Note that the configuration is not limited thereto. The four sensor pixels 12 share one readout circuit 22, and an output of each of the four sensor pixels 12 is input to the shared readout circuit 22. Although two pixel units PU are illustrated in FIG. 2, the number of pixel units PU is not limited thereto. Furthermore, similarly to the sensor pixels 12, the pixel units PU are arranged in a matrix (Y direction and X direction) in the pixel region 13 illustrated in FIG. 1.

The respective sensor pixels 12 have common components. In FIG. 2, in order to distinguish the components of each sensor pixel 12 from each other, identification numbers (1, 2, 3, and 4) are added to the end of the reference signs (for example, PD, TG, and FD described later) of the components of each sensor pixel 12. In the following, in a case where it is necessary to distinguish the components of each sensor pixel 12 from each other, the identification number is attached to the end of the reference sign of the component of each sensor pixel 12, but in a case where it is not necessary to distinguish the components of each sensor pixel 12 from each other, the identification number at the end of the reference sign of the component of each sensor pixel 12 is omitted.

In addition, in FIG. 2, in order to distinguish the components of each readout circuit 22 from each other, identification numbers (1 and 2) are added to the end of the reference signs (for example, AMP, SEL, FDG, and RST described later) of the components of each readout circuit 22. In the following, in a case where it is necessary to distinguish the components of each readout circuit 22 from each other, the identification number is attached to the end of the reference sign of the component of each readout circuit 22, but in a case where it is not necessary to distinguish the components of each readout circuit 22 from each other, the identification number at the end of the reference sign of the component of each readout circuit 22 is omitted.

As illustrated in FIG. 2, each sensor pixel 12 includes, for example, a photodiode PD as an example of a photoelectric conversion element, a transfer transistor TR electrically connected to the photodiode PD, and a floating diffusion FD that temporarily holds an electric charge output from the photodiode PD via the transfer transistor TR. The photodiode PD generates electric charges corresponding to an amount of received light by photoelectric conversion. A cathode region of the photodiode PD is electrically connected to a source region of the transfer transistor TR, and an anode region of the photodiode PD is electrically connected to a reference potential line (for example, ground). A drain region of the transfer transistor TR is electrically connected to the floating diffusion FD, and a gate electrode of the transfer transistor TR is electrically connected to the pixel drive line 23. The transfer transistor TR is, for example, a metal oxide semiconductor field effect transistor (MOSFET) in which a gate insulating film 109 (see FIG. 5) includes a silicon oxide (SiO$_2$) film. Alternatively, the transfer transistor TR may be a metal insulator semiconductor FET (MISFET) in which the gate insulating film 209 includes a silicon nitride (Si$_3$N$_4$) film or a multilayer film such as a silicon nitride film and a silicon oxide film. The floating diffusion FD includes an n-type contact region 105 (see FIGS. 4 and 7) to be described later.

As illustrated in FIG. 2, the floating diffusions FD of the sensor pixels 12 sharing one readout circuit 22 are electrically connected to each other and are electrically connected to an input end of the common readout circuit 22. The readout circuit 22 includes, for example, an amplification transistor AMP, a selection transistor SEL, a switching transistor FDG, and a reset transistor RST as the plurality of transistors. Note that the selection transistor SEL and the switching transistor FDG may be omitted as necessary.

The switching transistor FDG has a source region (input end of the readout circuit 22) electrically connected to the floating diffusions FD and a gate electrode 206a of the amplification transistor AMP, and a drain region electrically connected to a source region of the reset transistor RST. Further, a gate electrode of the switching transistor FDG is electrically connected to a switching transistor drive line of the pixel drive line 23 (see FIG. 1).

The reset transistor RST has a source region electrically connected to the drain region of the switching transistor FDG, and a drain region electrically connected to a power supply line VDD and the drain region of the amplification transistor AMP. Further, a gate electrode of the reset transistor RST is electrically connected to a reset transistor drive line of the pixel drive line 23 (see FIG. 1).

The amplification transistor AMP has a source region electrically connected to the drain region of the selection transistor SEL, and the drain region electrically connected to the power supply line VDD and the drain region of the reset transistor RST. In addition, the gate electrode of the amplification transistor AMP is electrically connected to the source region of the switching transistor FDG and the floating diffusions FD.

The selection transistor SEL has a source region electrically connected to the vertical signal line 24, and the drain region electrically connected to the source region of the amplification transistor AMP. Further, a gate electrode of the selection transistor SEL is electrically connected to a selection transistor drive line of the pixel drive line 23 (see FIG. 1).

Note that, in a case where the selection transistor SEL is not provided, the source region of the amplification transistor AMP is electrically connected to the vertical signal line 24. In addition, in a case where the switching transistor FDG is not provided, the source region of the reset transistor RST is electrically connected to the gate electrode of the amplification transistor AMP and the floating diffusions FD.

Figure 5:
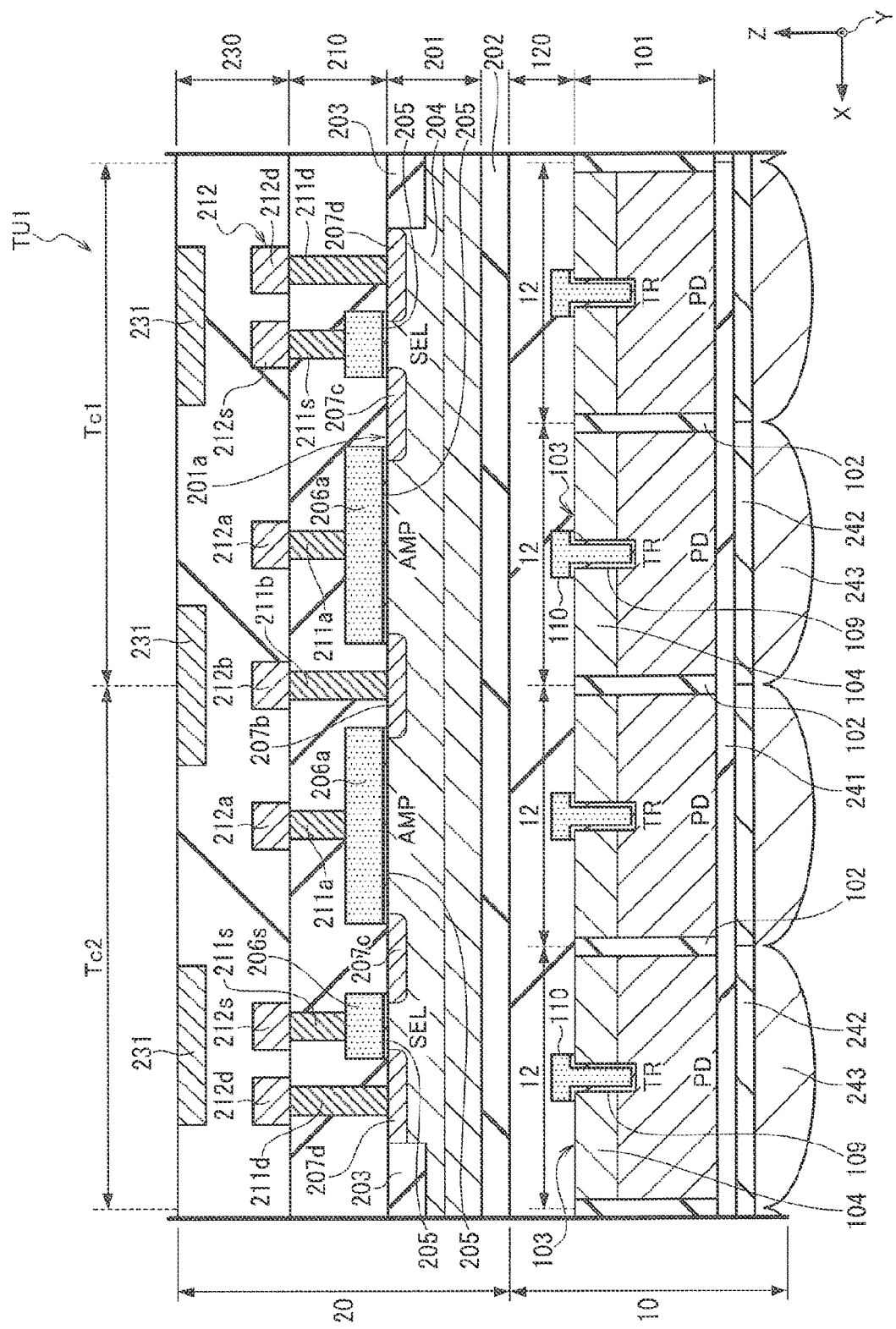
FIG. 5 is a schematic cross-sectional view illustrating a cross-sectional structure taken along line Ia-Ia in FIG. 3.

The transfer transistor TR transfers electric charges of the photodiode PD to the floating diffusion FD when turned on. A gate electrode 110 of the transfer transistor TR extends, for example, from the surface of the semiconductor layer 101 to a depth reaching the photodiode PD through a well region 104 as illustrated in FIG. 5 to be described later.

The reset transistor RST resets the potential of the floating diffusions FD to a predetermined potential. The reset transistor RST resets the potential of the floating diffusions FD to a potential of the power supply line VDD when turned on. The selection transistor SEL controls the output timing of the pixel signal from the readout circuit 22.

The amplification transistor AMP generates a signal of a voltage corresponding to the level of the electric charges held in the floating diffusion FD as a pixel signal. The amplification transistor AMP constitutes a source follower type amplifier, and outputs a pixel signal having a voltage corresponding to the level of the electric charges generated in the photodiode PD. When the selection transistor SEL is turned on, the amplification transistor AMP amplifies the potential of the floating diffusion FD, and outputs a voltage corresponding to the potential to the column signal processing circuit 34 via the vertical signal line 24.

The switching transistor FDG controls electric charge accumulation by the floating diffusion FD, and adjusts the multiplication factor of the voltage according to the potential multiplied by the amplification transistor AMP.

The amplification transistor AMP, the selection transistor SEL, the switching transistor FDT, and the reset transistor RST are, for example, MOSFETs. Further, these transistors (AMP, SEL, FDG, and RST) may be MISFETs.

<<Specific Configuration of Substrate Section>>

Next, specific configurations of the first substrate section 10 and the second substrate section 20 will be described with reference to FIGS. 3 to 7.

Figure 4:
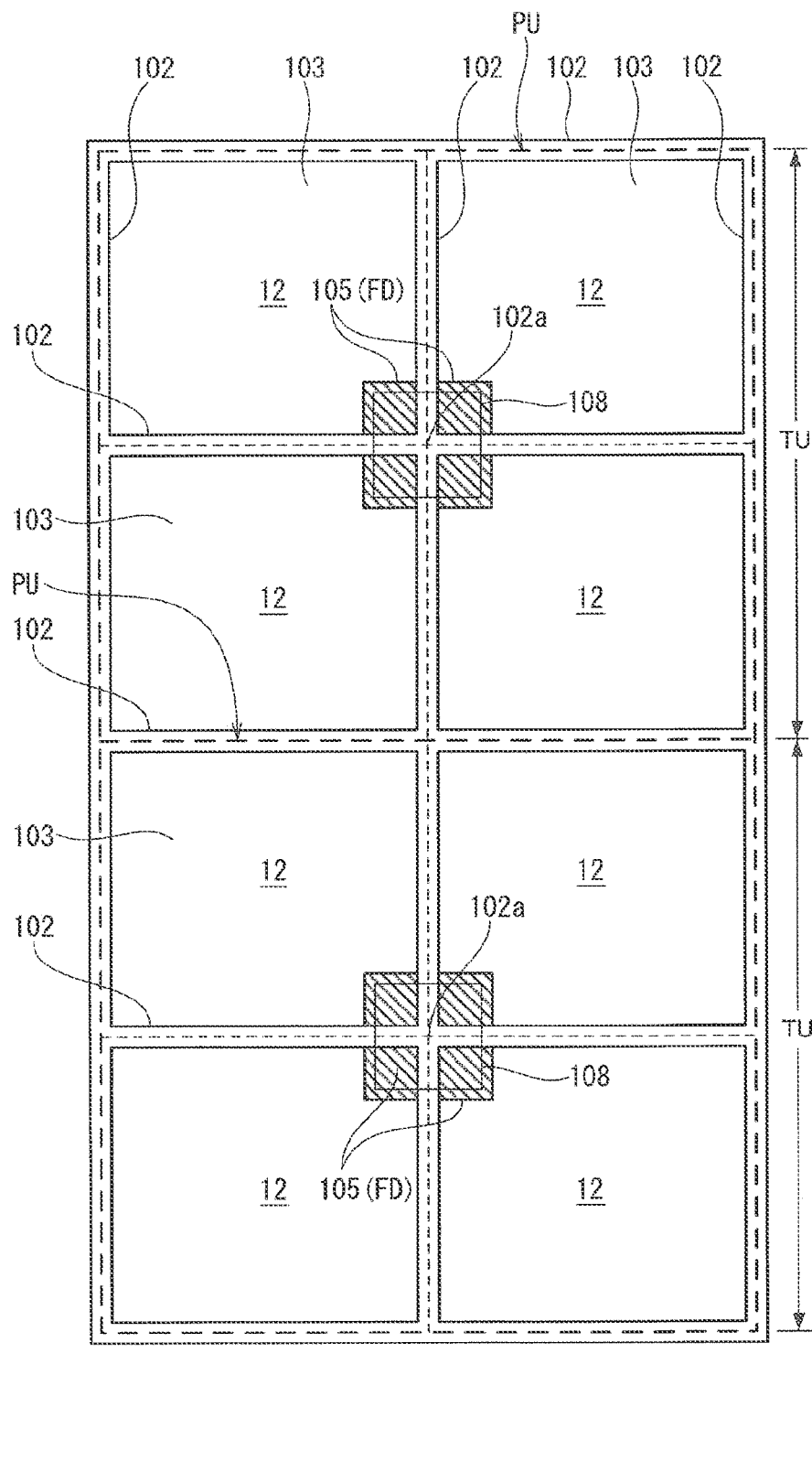
FIG. 4 is a diagram illustrating a planar layout of sensor pixels in the pixel unit mounted on the solid-state imaging device according to the first embodiment of the present technology.
Figure 6:
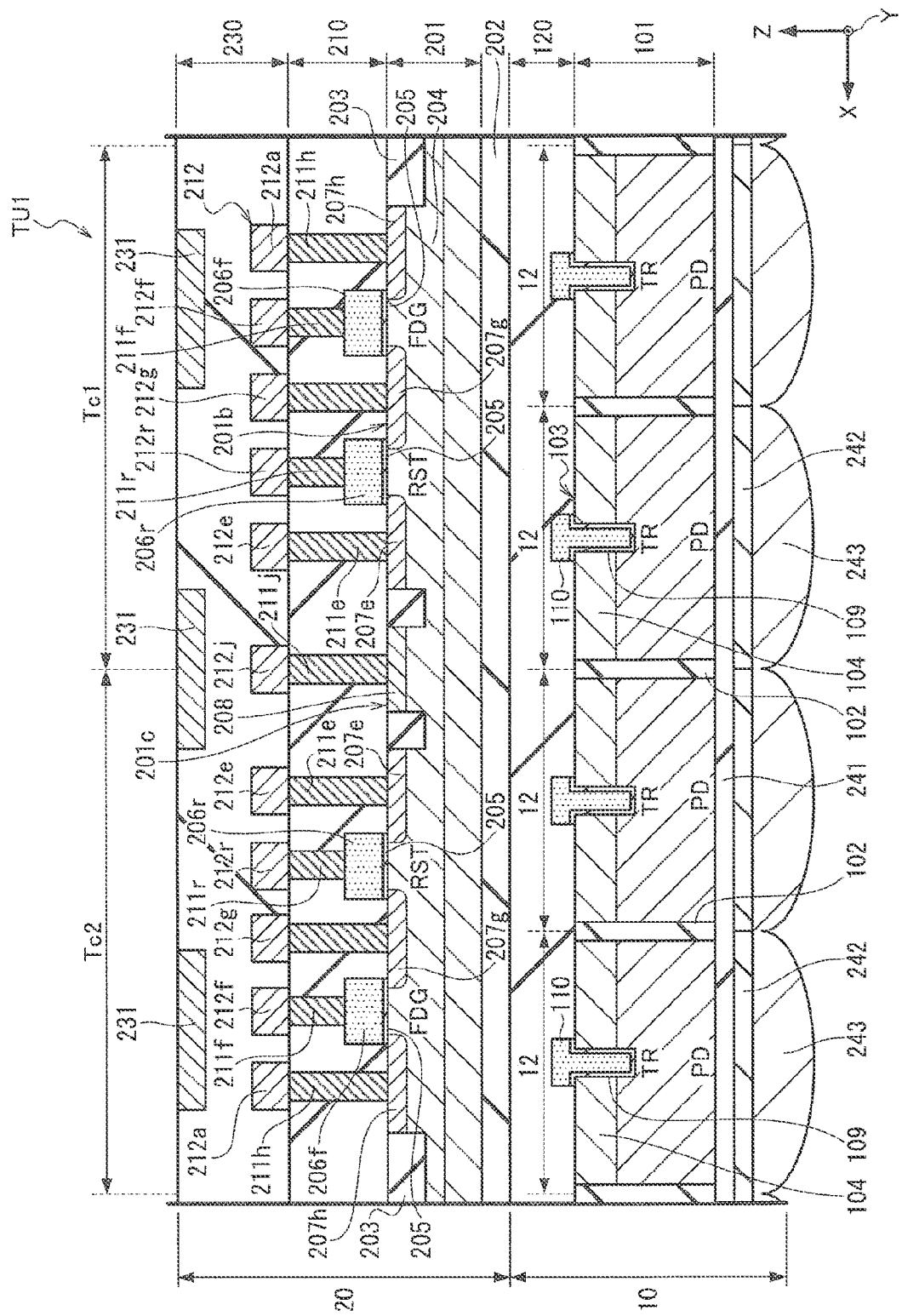
FIG. 6 is a schematic cross-sectional view illustrating a cross-sectional structure taken along line Ib-Ib in FIG. 3.
Figure 7:
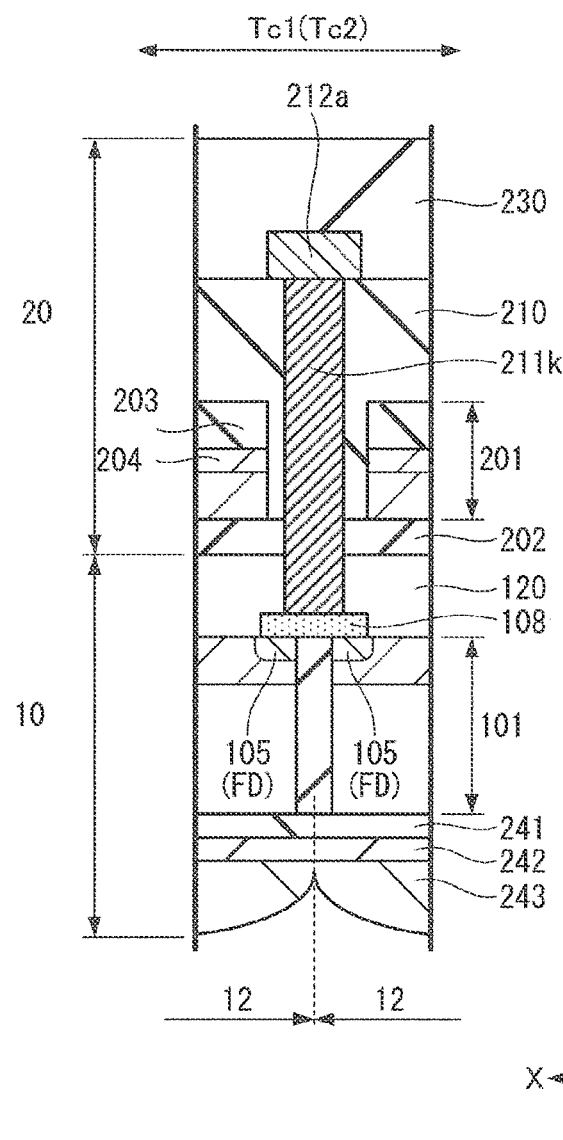
FIG. 7 is a schematic cross-sectional view illustrating a cross-sectional structure taken along line Ic-Ic in FIG. 3.

FIG. 3 is a layout plan view of first and second transistor cells Tc1 and Tc2 mounted on the solid-state imaging device 1A according to the first embodiment of the present technology. FIG. 4 is a diagram illustrating a planar layout of the sensor pixels 12 in the pixel unit PU mounted on the solid-state imaging device 1A according to the first embodiment of the present technology. FIG. 5 is a schematic cross-sectional view illustrating a cross-sectional structure taken along line Ia-Ia in FIG. 3. FIG. 6 is a schematic cross-sectional view illustrating a cross-sectional structure taken along line Ib-Ib in FIG. 3. FIG. 7 is a schematic cross-sectional view illustrating a cross-sectional structure taken along line Ic-Ic in FIG. 3.

Note that the cross-sectional views of main parts illustrated in FIGS. 5 to 7 are merely schematic, and do not intend to strictly indicate the actual structure. In the cross-sectional views of main parts illustrated in FIGS. 5 to 7, the positions of the transistors and the semiconductor regions (impurity diffusion regions) in the horizontal direction are intentionally changed in order to provide a clear description of the configuration of the solid-state imaging device 1A on paper. In addition, FIGS. 5 to 7 do not illustrate the third substrate section.

<First Substrate Section>

As illustrated in FIGS. 5 and 6, the second substrate section 20 is stacked on the main surface side (first surface side) which is one of surfaces of the first substrate section 10. In addition, although not illustrated, the third substrate section 30 is stacked on the main surface side (first surface side) which is one of surfaces of the second substrate section 20.

The first substrate section 10 includes a semiconductor layer 101 and an insulating layer 120 covering the semiconductor layer 101. In addition, a back surface (second surface) of the first substrate section 10 opposite to the main surface (first surface) is a light entrance surface. In addition, a planarization film 241, a color filter 242, a microlens 243, and the like are provided on the back surface side of the first substrate section 10. The planarization film 241 planarizes the back surface side of the first substrate section 10. The microlens 243 condenses incident light on the first substrate section 10. The color filter 242 color-separates light entering the first substrate section 10. The color filter 242 and the microlens 243 are provided for each sensor pixel 12.

The semiconductor layer 101 has a plurality of island regions 103 as a plurality of element formation regions. The island regions 103 are disposed adjacent to each other with an isolation region 102 interposed therebetween in plan view. Each of the island regions 103 is provided with the photodiode PD and the transfer transistor TR. The semiconductor layer 101 is formed by grinding the back surface side of the semiconductor substrate by, for example, a CMP method until a plurality of element formation regions partitioned by the isolation region 102 is formed as individual island regions 103 during a manufacturing process. As the semiconductor layer 101, a first conductivity type (for example, n-type) single-crystalline silicon substrate is used. That is, each of the plurality of island regions 103 mainly includes the n-type semiconductor layer 101.

The isolation region 102 electrically isolates the neighboring island regions 103 from each other. The isolation region 102 has, for example, a shallow trench isolation (STI) structure and extends in the depth direction from the main surface of the semiconductor layer 101.

One island region 103 corresponds to one sensor pixel 12. A well region 104 including a second conductivity type (for example, p-type) semiconductor region is provided in a surface layer portion of the island region 103. In addition, the photodiode PD is provided in a region deeper than the well region 104. Further, the transfer transistor TR is provided in the surface layer portion of the island region 103. Although not illustrated in detail, the transfer transistor TR includes: a gate insulating film 109 provided along the inner wall of a gate groove extending in the depth direction from the main surface of the island region 103; a T-shaped gate electrode 110 having a part embedded in the gate groove via the gate insulating film 109 and another part protruding from the gate groove; and a pair of main electrode regions (not illustrated) functioning as a source region and a drain region. The pair of main electrode regions includes an n-type semiconductor region, and is provided inside the well region 104.

In addition, as illustrated in FIGS. 4 and 7, an n-type contact region 105 is provided inside the well region 104 on the isolation region 102 side of the surface layer portion of the island region 103. As illustrated in FIG. 4, the contact region 105 is provided in contact with an intersection 102a located at a central portion of a pixel unit PU having four sensor pixels 12 as one unit among intersections where the isolation region 102 extending in the row direction (Y direction) and the isolation region 102 extending in the column direction (X direction) intersect. The contact region 105 reduces ohmic contact resistance with a conductive pad 108 described later and shares the floating diffusions FD.

As illustrated in FIGS. 4 and 7, the above-described conductive pad 108 is electrically and mechanically connected to the contact regions 105 of the four island regions 103 arranged across the intersection 102a of the isolation region 102 in the central portion of the pixel unit PU, the conductive pad 108 extending across the intersection 102a of the isolation region 102.

As illustrated in FIGS. 5 and 6, the insulating layer 120 is provided on the entire surface of the semiconductor layer 101 so as to cover the island regions 103, the gate electrodes 110, and the conductive pad 108. The insulating layer 120 includes, for example, one of a silicon oxide film (SiO), a silicon nitride film (SiN), a silicon oxynitride (SiON) film, or a silicon carbonitride (SiCN) film, or a multilayer film obtained by layering two or more of these films.

<Second Substrate Section>

As illustrated in FIGS. 5 and 6, the second substrate section 20 includes a semiconductor layer 201, an insulating layer 210 provided on a main surface (first surface) of the semiconductor layer 201, and a wiring layer 212 provided on the insulating layer 210. In addition, the second substrate section 20 includes an insulating layer 230 provided on the wiring layer 212 and an insulating film 202 provided on the second surface side (first substrate section 10 side) of the semiconductor layer 201. Further, the second substrate section 20 includes a transistor cell unit TU1 illustrated in FIGS. 2, 3, 5, and 6.

As illustrated in FIGS. 5 and 6, the semiconductor layer 201 is disposed on the insulating layer 120 of the first substrate section 10 with the insulating film 202 therebetween. The insulating film 202 includes, for example, a silicon oxide film, and is bonded to the insulating layer 120 below the insulating film 202.

As illustrated in FIG. 3, the transistor cell unit TU1 includes a first transistor cell Tc1 and a second transistor cell Tc2 arranged adjacent to each other in the X direction. The first transistor cell Tc1 and the second transistor cell Tc2 include, for each readout circuit 22, an amplification transistor AMP, a selection transistor SEL, a reset transistor RST, and a switching transistor FDG as a plurality of transistors included in the readout circuit 22 (see FIG. 2), for example. That is, the transistor cell unit TU includes two transistor cells (Tc1 and Tc2) individually corresponding to the two readout circuits 22, and one of the two transistor cells is the first transistor cell Tc1 and the other is the second transistor cell Tc2. The transistors (amplification transistor AMP, reset transistor RST, selection transistor SEL, and switching transistor FDG) of the first transistor cell Tc1 and the transistors (amplification transistor AMP, reset transistor RST, selection transistor SEL, and switching transistor FDG) of the second transistor cell Tc2 have similar configurations.

As illustrated in FIGS. 3, 5, and 6, element formation regions (active regions) 201a and 201b defined by the isolation region 203 are provided on the main surface of the semiconductor layer 201 in the transistor cell unit TU1. In addition, the main surface of the semiconductor layer 201 is provided with a feeding region 201c defined by the isolation region 203. The isolation region 203 is configured with, for example, an STI structure in which a groove extending in the depth direction from the main surface of the semiconductor layer 201 is formed and an insulating film is selectively embedded in the groove. Note that the isolation region 203 is not limited to the above configuration. A well region 204 including a p-type semiconductor region is provided in a surface layer portion on the main surface side of the semiconductor layer 201.

As illustrated in FIG. 3, the element formation region 201a extends over the first transistor cell Tc1 and the second transistor cell Tc2 in the X direction. The element formation region 201b is adjacent to the element formation region 201a, extends in the X direction side by side with the element formation region 201a, and is individually provided in each of the first and second transistor cells Tc1 and Tc2. The feeding region 201c is provided across the boundary between the first transistor cell Tc1 and the second transistor cell Tc2 between the two element formation regions 201b. The first and second transistor cells Tc1 and Tc2 have an inversion pattern in which the element forming region 201a, the element formation regions 201b, and the feeding region 201c are inverted with the boundary between the first transistor cell Tc1 and the second transistor cell Tc2 as an inversion axis. In other words, in the first and second transistor cells Tc1 and Tc2, the element forming region 201a, the element formation regions 201b, and the feeding region 201c are linearly symmetric with respect to the boundary between the first transistor cell Tc1 and the second transistor cell Tc2 as a symmetric line.

As illustrated in FIGS. 3 and 5, the amplification transistors AMP (AMP1, AMP2) of the first and second transistor cells Tc1 and Tc2 and the selection transistors SEL (SEL1, SEL2) of the first and second transistor cells Tc1 and Tc2 are provided in series in the element formation region 201a on the main surface of the semiconductor layer 201.

The amplification transistor AMP includes a gate insulating film 205 provided on the main surface of the semiconductor layer 201 and a gate electrode 206a provided on the gate insulating film 205. In addition, the amplification transistor AMP includes a pair of main electrode regions 207b and 207c which is provided in the well region 204 of the semiconductor layer 201 to be separated from each other in the channel length direction with a channel formation region immediately below the gate electrode 206a interposed therebetween, and which functions as a source region and a drain region. The pair of main electrode regions 207b and 207c includes an n-type semiconductor region.

The selection transistor SEL includes the gate insulating film 205 provided on the main surface of the semiconductor layer 201 and a gate electrode 206s provided on the gate insulating film 205. In addition, the selection transistor SEL includes a pair of main electrode regions 207d and 207c which is provided in the well region 204 of the semiconductor layer 201 to be separated from each other in the channel length direction with the channel formation region immediately below the gate electrode 206s interposed therebetween, and which functions as a source region and a drain region. The pair of main electrode regions 207d and 207c includes an n-type semiconductor region.

The amplification transistor AMP and the selection transistor SEL share the main electrode region 207c which is a second main electrode region (source region) of the amplification transistor AMP and which is a first main electrode region (drain region) of the selection transistor SEL.

As illustrated in FIGS. 3 and 6, the reset transistor RST (RST1, RST2) of each of the first and second transistor cells Tc1 and Tc2 and the switching transistor FDG (FDG1, FDG2) of each of the first and second transistor cells Tc1 and Tc2 are provided in series in the element formation region 201b on the main surface of the semiconductor layer 201.

The reset transistor RST includes the gate insulating film 205 provided on the main surface of the semiconductor layer 201 and a gate electrode 206r provided on the gate insulating film 205. In addition, the reset transistor RST includes a pair of main electrode regions 207e and 207g which is provided in the well region 204 of the semiconductor layer 201 to be separated from each other in the channel length direction with the channel formation region immediately below the gate electrode 206r interposed therebetween, and which functions as a source region and a drain region. The pair of main electrode regions 207e and 207g includes an n-type semiconductor region.

The switching transistor FDG includes the gate insulating film 205 provided on the main surface of the semiconductor layer 201 and a gate electrode 206f provided on the gate insulating film 205. In addition, the switching transistor FDG includes a pair of main electrode regions 207h and 207g which is provided in the well region 204 of the semiconductor layer 201 to be separated from each other in the channel length direction with the channel formation region immediately below the gate electrode 206f interposed therebetween, and which functions as a source region and a drain region. The pair of main electrode regions 207h and 207g includes an n-type semiconductor region.

The reset transistor RST and the switching transistor FDG share the main electrode region 207g which is a second main electrode region (source region) of the reset transistor RST and which is a first main electrode region (drain region) of the switching transistor FDG.

As illustrated in FIGS. 3 and 6, a contact region 208 including a p-type semiconductor region having a higher impurity concentration than the well region 204 is provided in the feeding region 201c on the main surface of the semiconductor layer 201. The contact region 208 reduces ohmic contact resistance with a contact electrode 211j described later.

As illustrated in FIGS. 5 and 6, in the first and second transistor cells Tc1 and Tc2, the gate electrodes 206a, 206s, 206r, and 206f of the amplification transistor AMP (AMP1, AMP2), the selection transistor SEL (SEL1, SEL2), the reset transistor RST (RST1, RST2), and the switching transistor FDG (FDG1, FDG2) are covered with the insulating layer 210 provided on the main surface of the semiconductor layer 201. Wires 212a, 212b, 212d, 212e, 212f, 212g, 212j, 212r, and 212s are provided in the wiring layer 212 on the insulating layer 210. These wires 212a, 212b, 212d, 212e, 212f, 212g, 212j, 212r, and 212s are covered with the insulating layer 230 provided on the insulating layer 210. In addition, a wire 231 is provided on a surface layer portion of the insulating layer 230.

The wire 231 and the wires in the wiring layer 212 include, for example, a metal film such as copper (Cu) or an alloy having Cu as a main component. The insulating layers 230 and 220 include, for example, one of a silicon oxide film ($SiO_2$), a silicon nitride film ($Si_3N_4$), a silicon oxynitride (SiON) film, or a silicon carbonitride (SiCN) film, or a multilayer film obtained by layering two or more of these films.

The semiconductor layer 201 includes, for example, a p-type semiconductor substrate containing single-crystal silicon. The gate insulating film 205 includes, for example, a silicon oxide ($SiO_2$) film. The gate electrode (206a, 206s, 206r, 206f) includes, for example, a composite film obtained by layering a silicide film on another crystalline silicon film into which an impurity for reducing a resistance value is introduced.

As illustrated in FIGS. 3 and 5, in each of the first and second transistor cells Tc1 and Tc2, the gate electrode 206a of the amplification transistor AMP is electrically connected to one end of the wire 212a provided on the insulating layer 210 via a contact electrode 211a embedded in the insulating layer 210. The wire 212a is routed such that, in plan view, one end side overlaps the gate electrode 206a of the amplification transistor AMP, the other end side overlaps the main electrode region 207h which is the second main electrode region (source region) of the switching transistor FDG, and an intermediate portion overlaps the conductive pad 108 (see FIG. 7) of the first substrate section 10.

As illustrated in FIGS. 3 and 5, in each of the first and second transistor cells Tc1 and Tc2, the gate electrode 206s of the selection transistor SEL is electrically connected to the wire 212s provided on the insulating layer 210 via a contact electrode 211s embedded in the insulating layer 210. The main electrode region 207d which is the second main electrode region (source region) of the selection transistor SEL is electrically connected to the wire 212d provided on the insulating layer 210 via a contact electrode 211d embedded in the insulating layer 210. Although not illustrated in detail, the wire 212d is electrically connected to the vertical signal line 24 (see FIGS. 1 and 2). The main electrode region 207c which serves as the first main electrode region (drain region) of the selection transistor SEL also serves as the second main electrode region (source region) of the amplification transistor AMP.

As illustrated in FIGS. 3 and 6, in each of the first and second transistor cells Tc1 and Tc2, the gate electrode 206r of the reset transistor RST is electrically connected to the wire 212r provided on the insulating layer 210 via a contact electrode 211r embedded in the insulating layer 210. Although not illustrated in detail, the wire 212r is electrically connected to the reset transistor drive line of the pixel drive line 23 (see FIG. 1). The main electrode region 207e which is the first main electrode region (drain region) of the reset transistor RST is electrically connected to the wire 212e provided on the insulating layer 210 via a contact electrode 211e embedded in the insulating layer 210. Although not illustrated in detail, the wire 212e is electrically connected to the power supply line VDD (see FIG. 2).

As illustrated in FIGS. 3 and 6, the gate electrode 206f of the switching transistor FDG is electrically connected to the wire 212f provided on the insulating layer 210 via a contact electrode 211f embedded in the insulating layer 210. The main electrode region 207h which is the second main electrode region (source region) of the switching transistor FDG is electrically connected to the wire 212a provided on the insulating layer 210 via a contact electrode 211h embedded in the insulating layer 210. The main electrode region 207g which serves as the first main electrode region (drain region) of the switching transistor FDG also serves as the second main electrode region (source region) of the reset transistor RST.

The main electrode region 207g that serves as both the first main electrode region of the switching transistor FDG and the second main electrode region of the reset transistor RST is electrically connected to the wire 212g provided on the insulating layer 210 via a contact electrode embedded in the insulating layer 210. The wire 212g is for applying a load capacitance, and is electrically connected only to the main electrode region 207g.

As illustrated in FIGS. 3 and 6, the contact region 208 is electrically connected to the wire 212j provided on the insulating layer 210 via a contact electrode 211j embedded in the insulating layer 210. Although not illustrated, the wire 212j is electrically connected to a line VSS to which a second reference potential lower than the first reference potential applied to the power supply line VDD is applied. That is, the second reference potential is supplied from the line VSS to the well region 204.

As illustrated in FIG. 7, the conductive pad 108 is electrically connected to an intermediate portion of the wire 212a provided on the insulating layer 210 via a contact electrode 211k embedded in a connection hole reaching the surface of the conductive pad 108 from the surface of the insulating layer 210. The contact electrode 211k penetrates an opening provided in the semiconductor layer 201 while being separated from the semiconductor layer 201, and is electrically isolated from the semiconductor layer 201 by a part of the insulating layer 210 provided between the contact electrode 211k and the semiconductor layer 201. As the contact electrode 211k and the above-described contact electrodes (211a, 211b, 211s, 211d, 211r, 211e, 211f, 211h, 211j), a high melting point material such as titanium (Ti), tungsten (W), cobalt (Co), or molybdenum (Mo) can be used, and for example, tungsten (W) is used. These contact electrodes may also be referred to as conductive plugs.

As illustrated in FIG. 3, in each of the first and second transistor cells Tc1 and Tc2, the amplification transistor AMP and the selection transistor SEL are provided in series in the element formation region 201a, and the reset transistor RST and the switching transistor FDG are provided in series in the element formation region 201b. In addition, the first and second transistor cells Tc1 and Tc2 have an inversion pattern in which the arrangement patterns of the transistors (AMP1, SELL, RST1, FDG1) of the first transistor cell Tc1 and the transistors (AMP2, SEL2, RST2, FDG2) of the second transistor cell Tc2 are inverted with the boundary between the first transistor cell Tc1 and the second transistor cell Tc2 as an inversion axis. In other words, in the first and second transistor cells Tc1 and Tc2, the arrangement patterns of these transistors (AMP, SEL, RST, FDG) are linearly symmetric with respect to the boundary between the first transistor cell Tc1 and the second transistor cell Tc2 as a symmetric line.

As illustrated in FIGS. 3 and 5, the amplification transistor AMP (AMP1) of the first transistor cell Tc1 and the amplification transistor AMP (AMP2) of the second transistor cell Tc2 are arranged adjacent to each other in the X direction, and the main electrode region 207b which is the first main electrode region of each of the amplification transistors AMP is shared. Further, the contact electrode 211b connected to the main electrode region 207b which is the first main electrode region of each of the amplification transistors AMP is also shared.

Further, the amplification transistor AMP of the first transistor cell Tc1 and the amplification transistor AMP of the second transistor cell Tc2 are aligned to be directed in the same direction such that the channel lengths (gate lengths) of the respective AMPs extend to the X direction.

As illustrated in FIGS. 3 and 5, in the first and second transistor cells Tc1 and Tc2, the planar patterns of the wire 212a of the first transistor cell Tc1 and the wire 212a of the second transistor cell Tc2 are inverted with the boundary between the first transistor cell Tc1 and the second transistor cell Tc2 as an inversion axis. In other words, in the first and second transistor cells Tc1 and Tc2, the planar patterns of the wires 212a are linearly symmetric with respect to the boundary between the first transistor cell Tc1 and the second transistor cell Tc2 as a symmetric line. In addition, the patterns of conductive paths electrically connecting the intermediate portions of the wires 212a and the conductive pad 108 are also linearly symmetric with respect to the boundary between the first transistor cell Tc1 and the second transistor cell Tc2 as a symmetric line. That is, the patterns of the conductive paths electrically connecting the gate electrodes 206a of the amplification transistors AMP and the second main electrode regions 207h of the switching transistors FDG to the contact regions 105 (floating diffusions FD) of the four sensor pixels 12 are linearly symmetric with respect to the boundary between the first transistor cell Tc1 and the second transistor cell Tc2 as a symmetric line.

Figure 8:
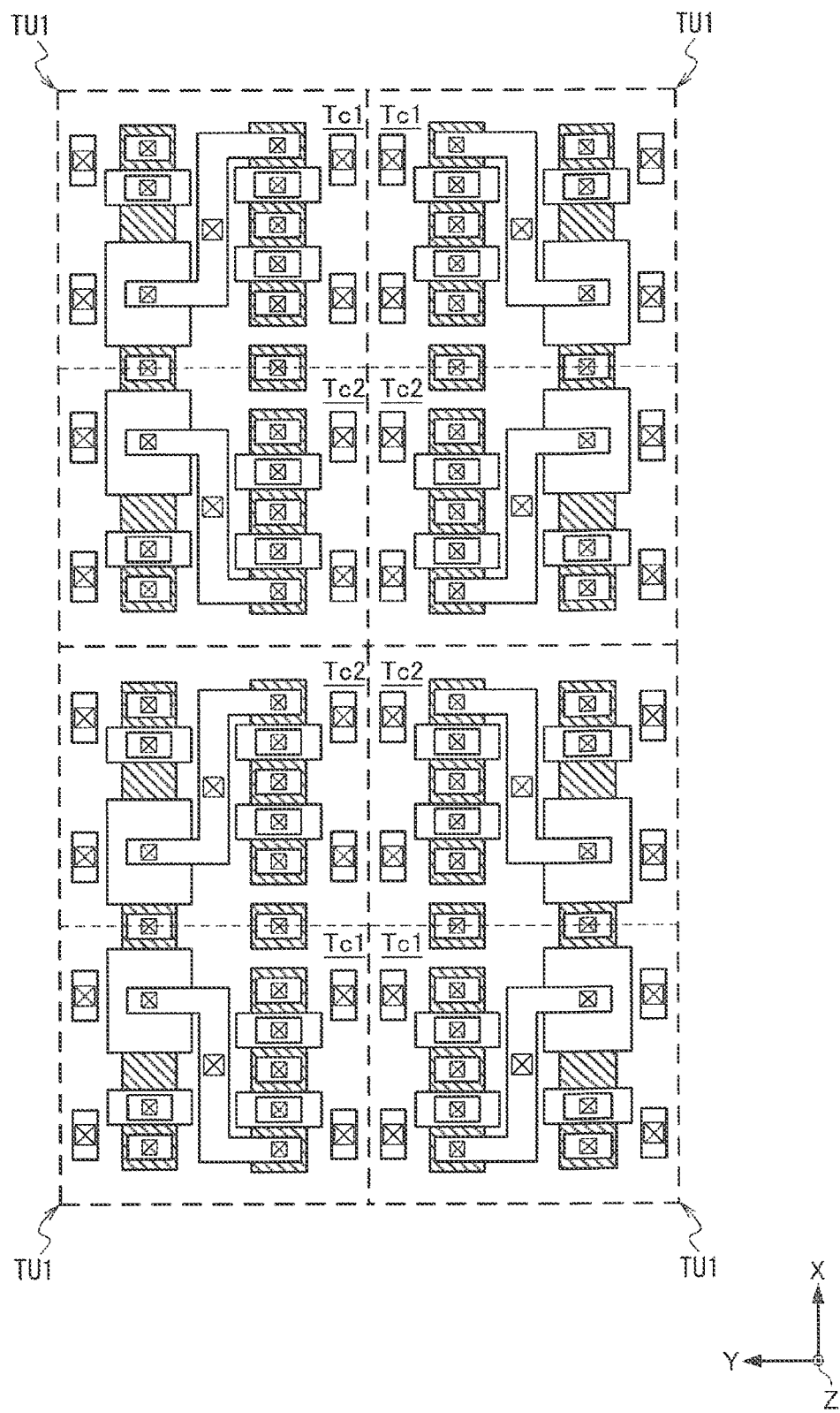
FIG. 8 is a layout plan view illustrating an arrangement example of transistor cell units.

As illustrated in FIG. 8, the transistor cell unit TU1 including the first and second transistor cells Tc1 and Tc2 as one unit are repeatedly arranged in line symmetry in each of the X direction and the Y direction in plan view. That is, the first and second transistor cells Tc1 and Tc2 are repeatedly arranged in line symmetry in the X direction and the Y direction in plan view. In the pixel region 13, four first transistor cells Tc1 adjacent to each other are arranged in line symmetry in each of the X direction and the Y direction, and four second transistor cells Tc2 adjacent to each other are arranged in line symmetry in each of the X direction and the Y direction.

Each of the first and second transistor cells Tc1 and Tc2 corresponds to one readout circuit 22 shared by the four sensor pixels 12. Therefore, the transistor cell unit TU1 of the first embodiment corresponds to the two readout circuits 22 and is shared by the eight sensor pixels 12.

Note that the inversion axis and the symmetric line are not physically formed.

<<Main Effects of First Embodiment>>

Next, main effects of the first embodiment will be described.

As described above, in the solid-state imaging device 1A according to the first embodiment, the sensor pixel 12 that performs photoelectric conversion is provided on the first substrate section 10, and the plurality of transistors (AMP, SEL, FDG, RST) included in the readout circuit 22 that outputs a pixel signal based on an electric charge output from the sensor pixel 12 is provided on the second substrate section 20. Then, the first substrate section 10 and the second substrate section 20 are stacked. By stacking the sensor pixel 12 and the plurality of transistors (AMP, SEL, FDG, RST) included in the readout circuit 22 using different substrate sections (10 and 20), the plurality of sensor pixels 12 (four in the first embodiment) sharing one readout circuit 22 can easily have the same repetitive structure, and a structure for reducing an optical sensitivity difference can be ensured.

Furthermore, as described above, the solid-state imaging device 1A according to the first embodiment includes, for each readout circuit 22, the plurality of transistors (AMP, SEL, FDG, RST) each included in the readout circuit 22, and includes the first and second transistor cells Tc1 and Tc2 arranged adjacent to each other in the X direction in plan view. In addition, the amplification transistors AMP (AMP1, AMP2) of the first and second transistor cells Tc1 and Tc2 are arranged adjacent to each other, and the main electrode region 207b which is the first main electrode region out of the pair of main electrode regions of each of the amplification transistors AMP (AMP1, AMP2) is shared. Therefore, the gate electrode 206a of the amplification transistor AMP (AMP1, AMP2) of each of the first and second transistor cells Tc1 and Tc2 can be extended to the first main electrode region 207b, by which the gate area (gate length Lg×gate width Wg) can be easily expanded.

Therefore, according to the solid-state imaging device 1A according to the first embodiment, it is possible to ensure a structure for reducing the optical sensitivity difference, and to reduce noise while suppressing an increase in the layout area of the first and second transistor cells Tc1 and Tc2 in which the plurality of transistors (AMP, SEL, FDG, RST) is arranged.

In the solid-state imaging device 1A according to the first embodiment, the amplification transistor AMP of the first transistor cell Tc1 and the amplification transistor AMP of the second transistor cell Tc2 are aligned to be directed in the same direction such that the channel lengths (gate lengths) of the respective AMPs extend to the X direction. Therefore, the gate electrodes 206a of the amplification transistors AMP (AMP1, AMP2) of the first and second transistor cells Tc1 and Tc2 can be substantially equally extended to the first main electrode region 207b, by which the gate areas (gate length Lg×gate width Wg) of the respective amplification transistors can be substantially the same.

In the solid-state imaging device 1A according to the first embodiment, the patterns of the conductive paths electrically connecting the gate electrodes 206a of the amplification transistors AMP and the main electrode regions 207h which are the second main electrode regions of the switching transistors FDG to the contact regions 105 (floating diffusions FD) of the four sensor pixels 12 are linearly symmetric with respect to the boundary between the first transistor cell Tc1 and the second transistor cell Tc2 as a symmetric line. Thus, parasitic capacitances of the conductive paths electrically connecting the gate electrodes 206a of the amplification transistors AMP and the second main electrode regions 207h of the switching transistors FDG to the contact regions 105 (floating diffusions FD) of the four sensor pixels 12 can be substantially the same between the first transistor cell Tc1 and the second transistor cell Tc2, whereby a variation in characteristics of the sensor pixels 12 among the pixel units PU can be suppressed.

Note that the above first embodiment has described the case where the transistor cell units TU each including the first and second transistor cells Tc1 and Tc2 as one unit are repeatedly arranged in line symmetry in each of the X direction and the Y direction in plan view. However, the arrangement of the transistor cell units TU according to the present technology is not limited thereto. For example, the transistor cell units TU each including the first and second transistor cells Tc1 and Tc2 as one unit may be arranged in each of the X direction and the Y direction to be directed in the same direction.

Furthermore, the above first embodiment has described a case where one readout circuit 22 is shared by four pixels 12. However, the present technology can also be applied to a case where one readout circuit 22 is shared by one or more sensor pixels.

Second Embodiment

The above first embodiment has described the configuration in which the main electrode region 207b which is the first main electrode region of the amplification transistor AMP (AMP1) in the first transistor cell Tc1 and the main electrode region 207b which is the first main electrode region of the amplification transistor AMP (AMP2) in the second transistor cell Tc2 are shared.

On the other hand, the second embodiment will describe a configuration in which the main electrode region 207e which is the first main electrode region of the reset transistor RST (RST1) in the first transistor cell Tc1a and the main electrode region 207e which is the first main electrode region of the reset transistor RST (RST2) in the second transistor cell Tc4 are shared.

A solid-state imaging device 1B according to the second embodiment of the present technology basically has a configuration similar to the configuration of the solid-state imaging device 1A according to the first embodiment described above, and includes a transistor cell unit TU2 instead of the transistor cell unit TU1 of the first embodiment described above as illustrated in FIGS. 9 and 10. Then, the arrangement of the element formation regions and the feeding region of the semiconductor layer 201 is different. The other configurations are substantially similar to those of the first embodiment described above.

Figure 9:
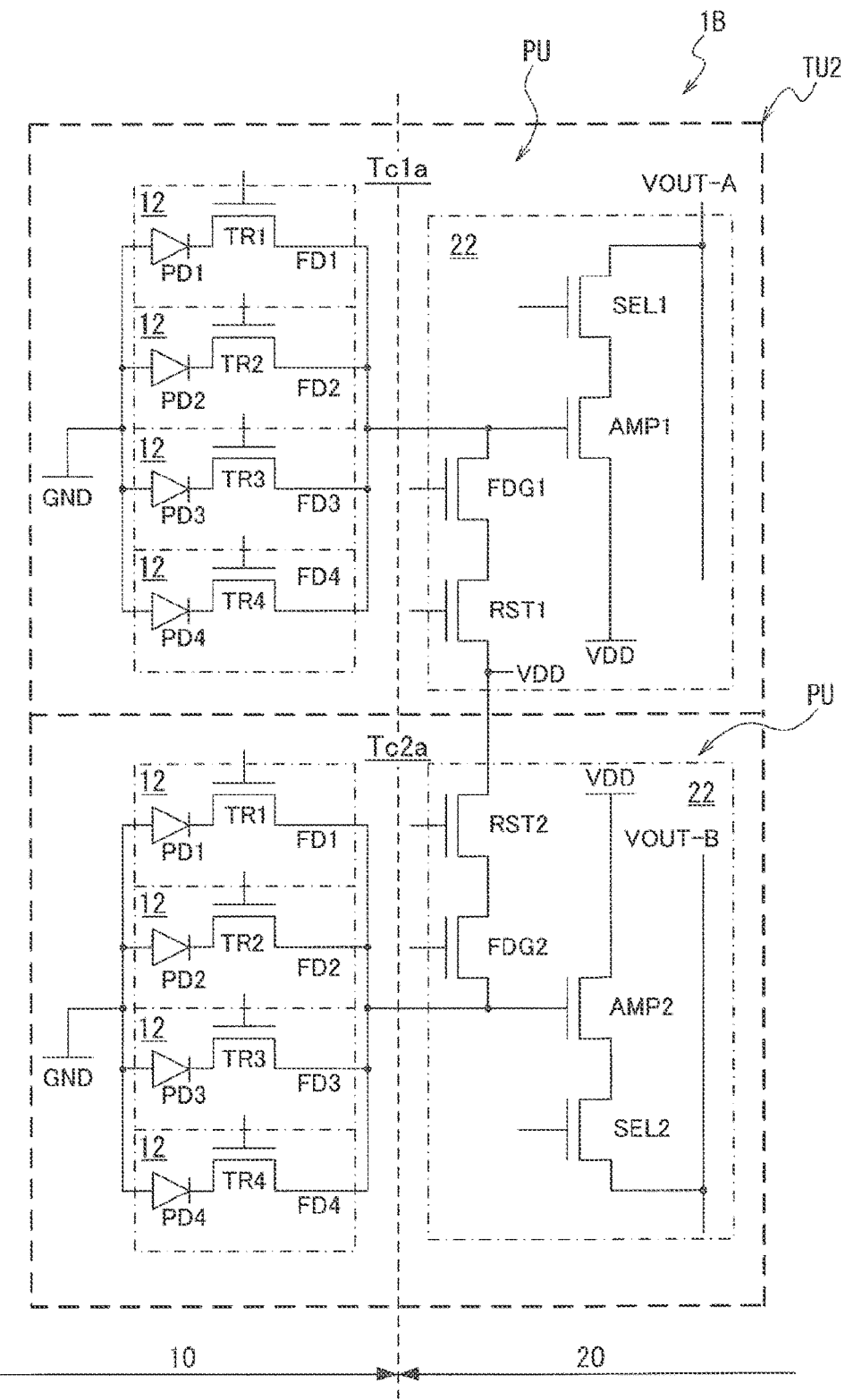
FIG. 9 is an equivalent circuit diagram of a pixel unit mounted on a solid-state imaging device according to a second embodiment of the present technology.
Figure 10:
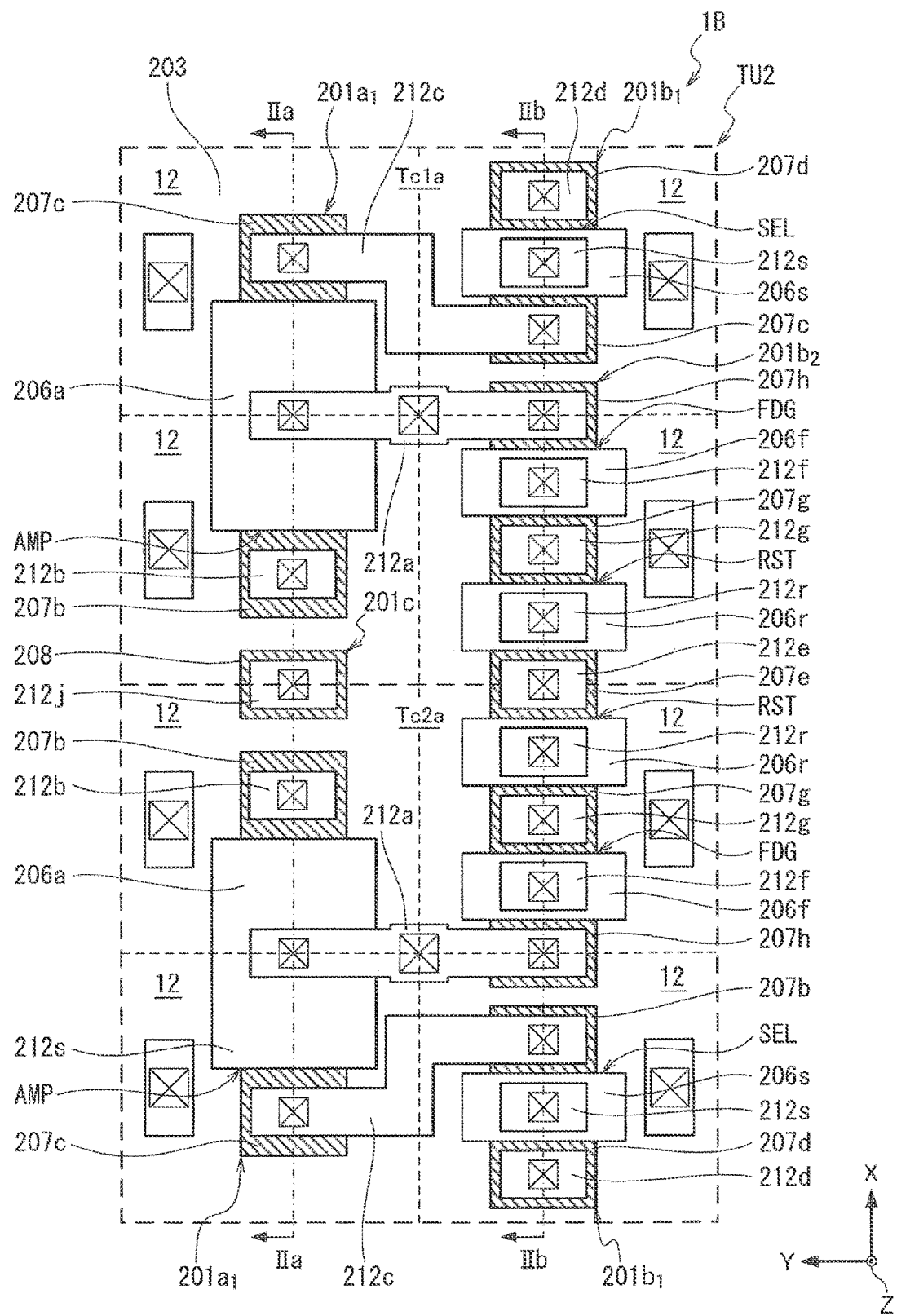
FIG. 10 is a layout plan view of first and second transistor cells mounted on the solid-state imaging device according to the second embodiment of the present technology.

As illustrated in FIGS. 9 and 10, the transistor cell unit TU2 includes a first transistor cell Tc1a and a second transistor cell Tc2a arranged adjacent to each other in the X direction. Similar to the first and second transistor cells Tc1 and Tc2 in the above first embodiment, each of the first transistor cell Tc1a and the second transistor cell Tc2a includes, for each readout circuit 22, an amplification transistor AMP, a selection transistor SEL, a switching transistor FDG, and a reset transistor RST as a plurality of transistors included in the readout circuit 22, for example. That is, the transistor cell unit TU2 includes two transistor cells (Tc1a and Tc2a) individually corresponding to the two readout circuits 22, and one of the two transistor cells is the first transistor cell Tc1a and the other is the second transistor cell Tc2a.

Figure 11:
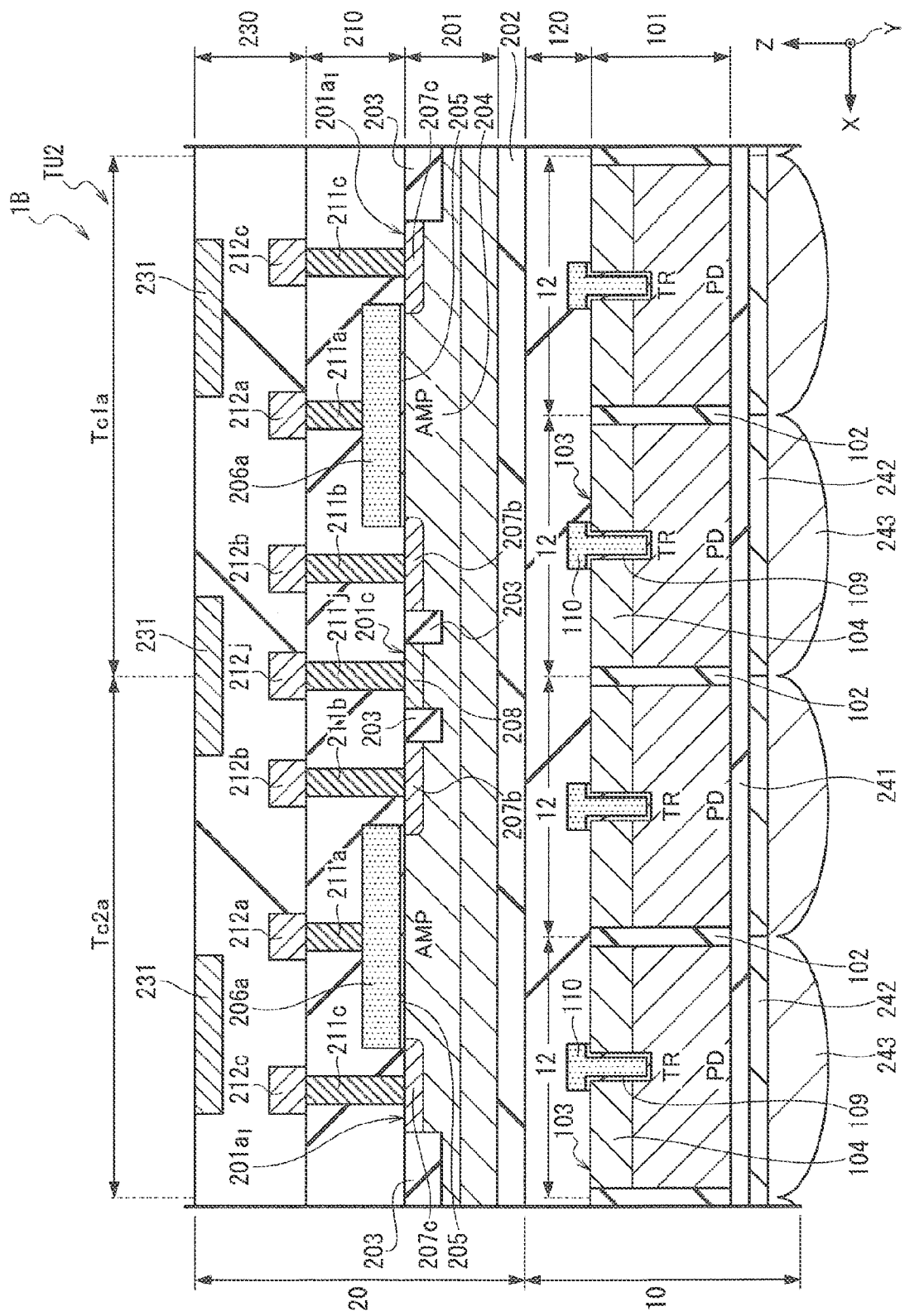
FIG. 11 is a schematic cross-sectional view illustrating a cross-sectional structure taken along line IIa-IIa in FIG. 10.
Figure 12:
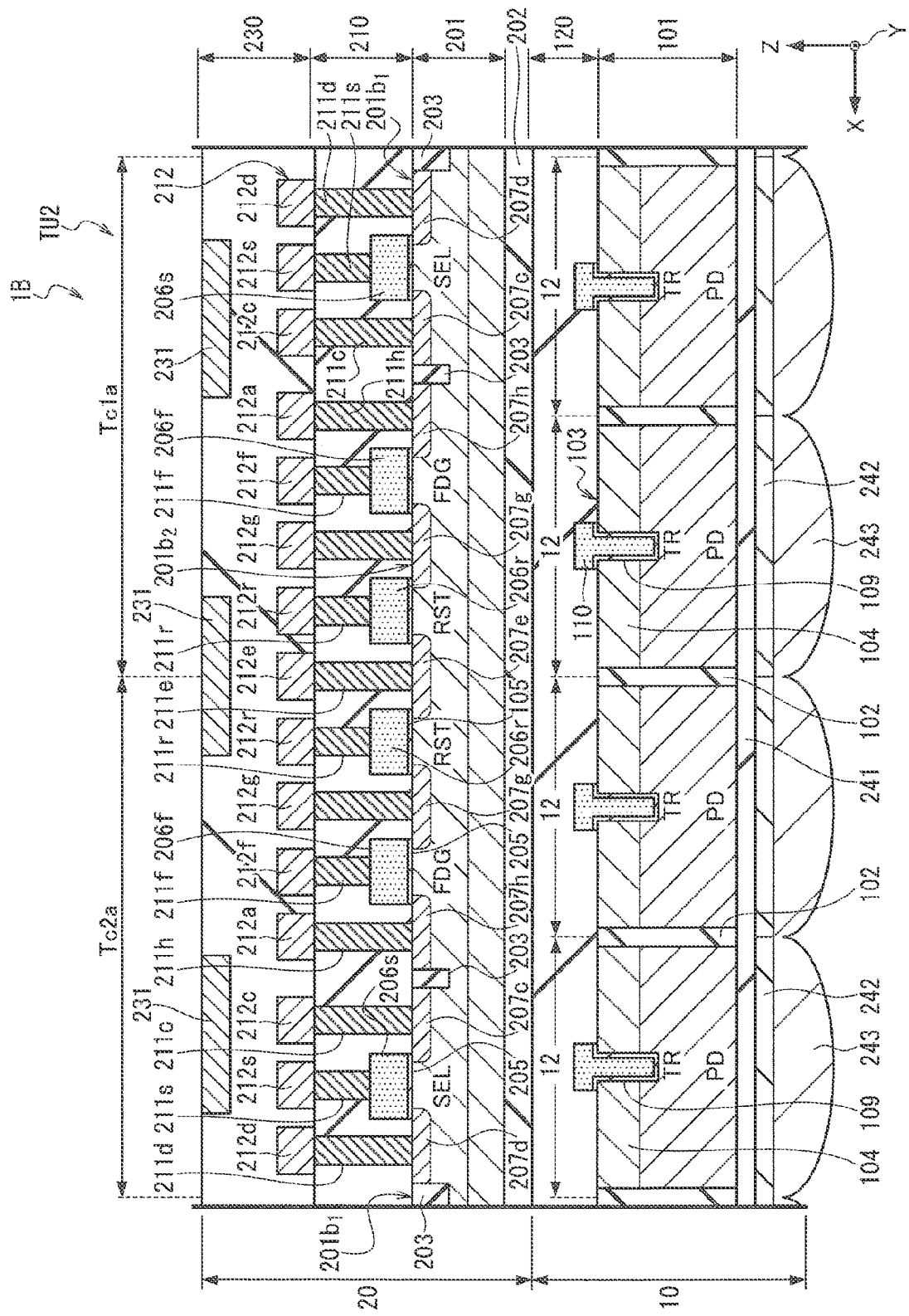
FIG. 12 is a schematic cross-sectional view illustrating a cross-sectional structure taken along line IIb-IIb in FIG. 10.
Figure 13:
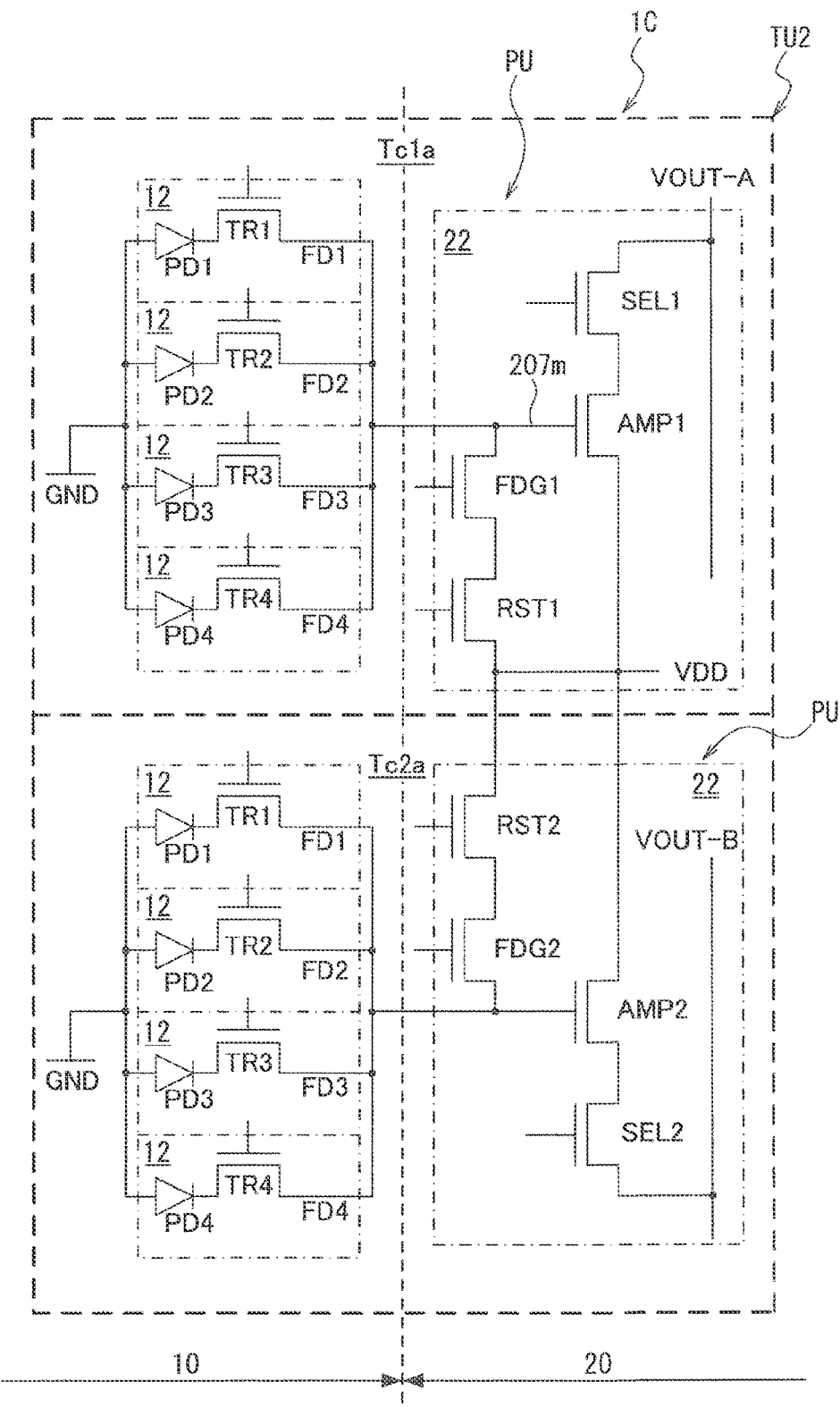
FIG. 13 is an equivalent circuit diagram of a pixel unit mounted on a solid-state imaging device according to a third embodiment of the present technology.
Figure 14:
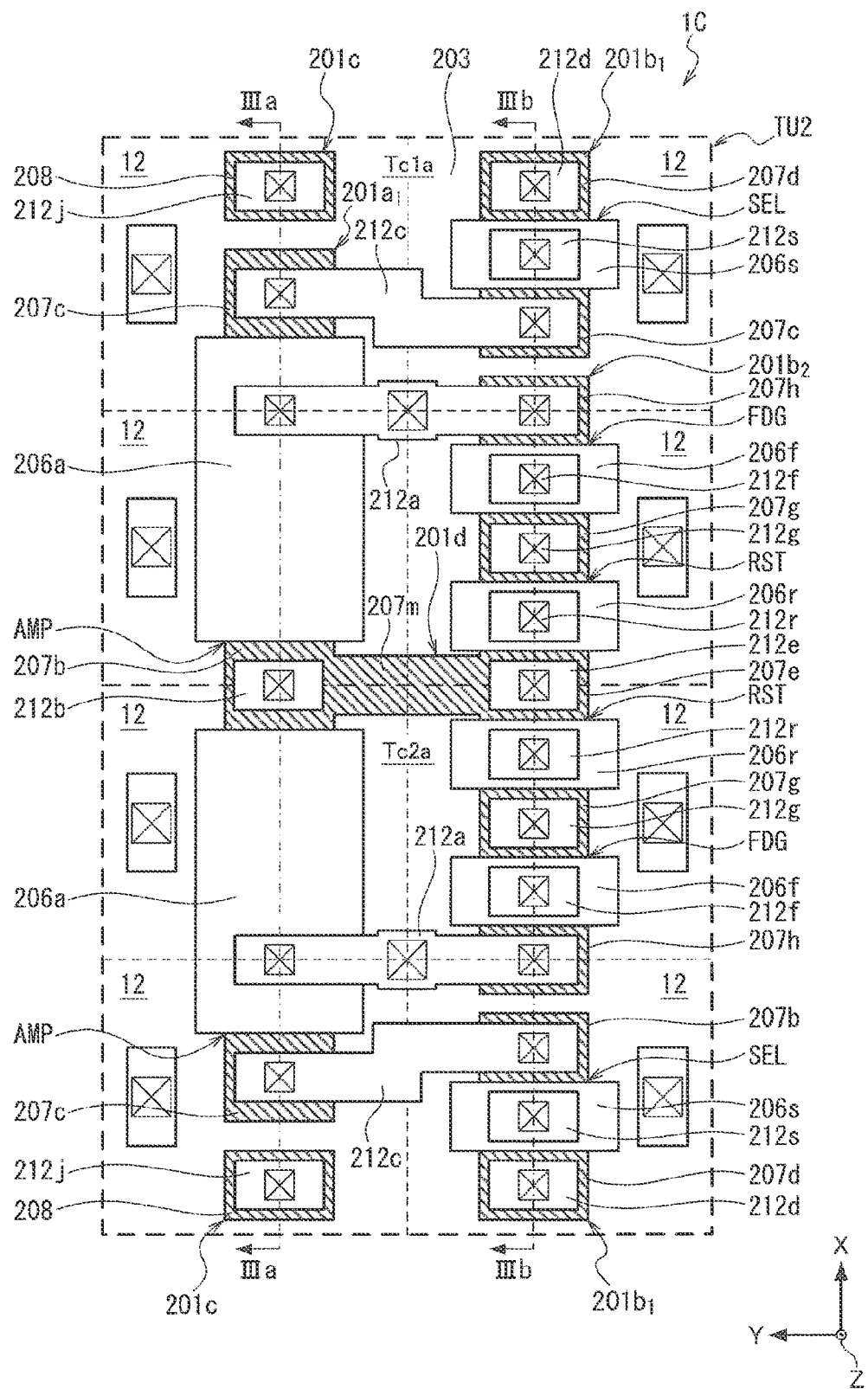
FIG. 14 is a layout plan view of first and second transistor cells mounted on the solid-state imaging device according to the third embodiment of the present technology.
Figure 15:
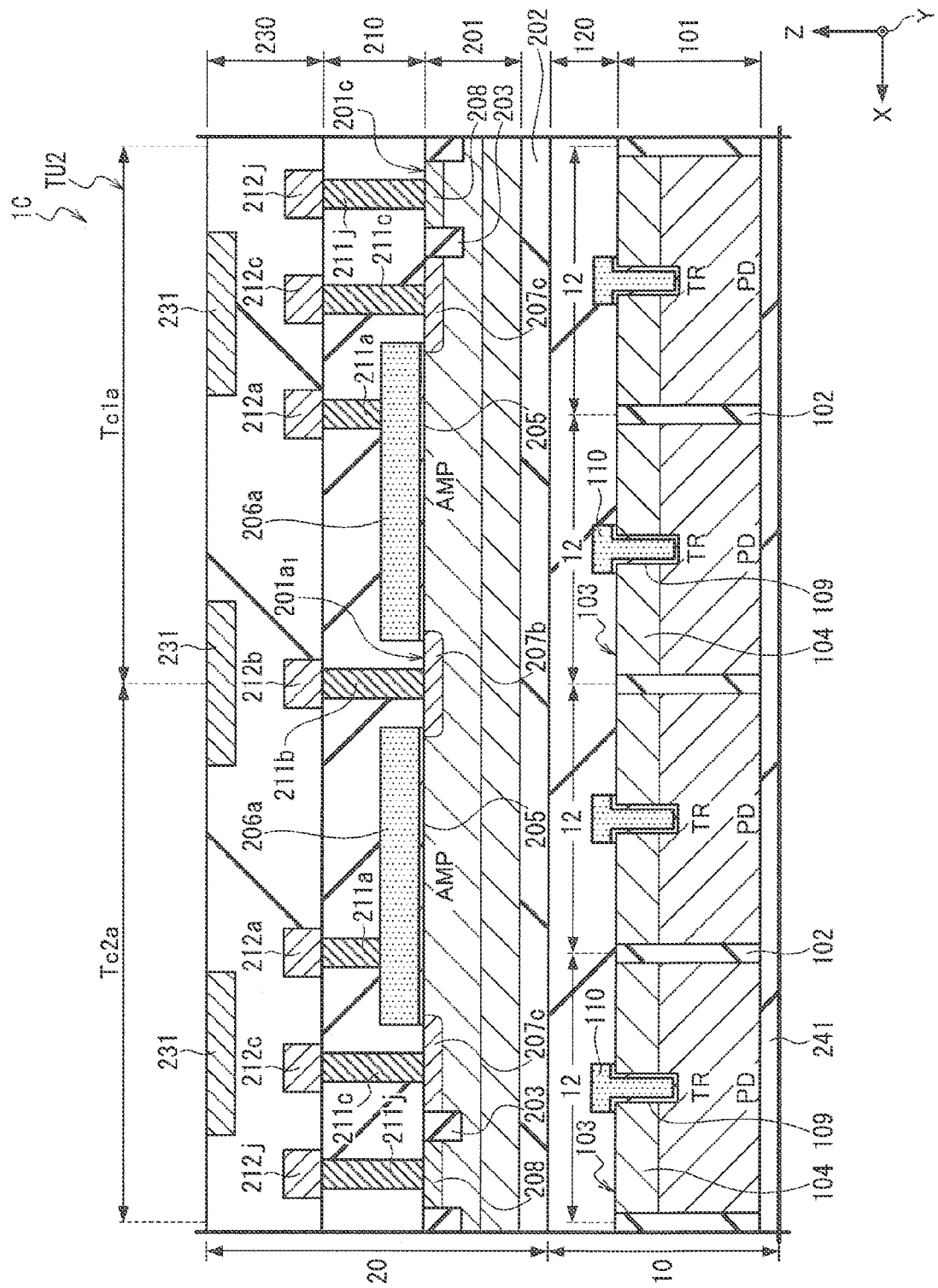
FIG. 15 is a schematic cross-sectional view illustrating a cross-sectional structure taken along line IIIa-IIIa in FIG. 13.
Figure 16:
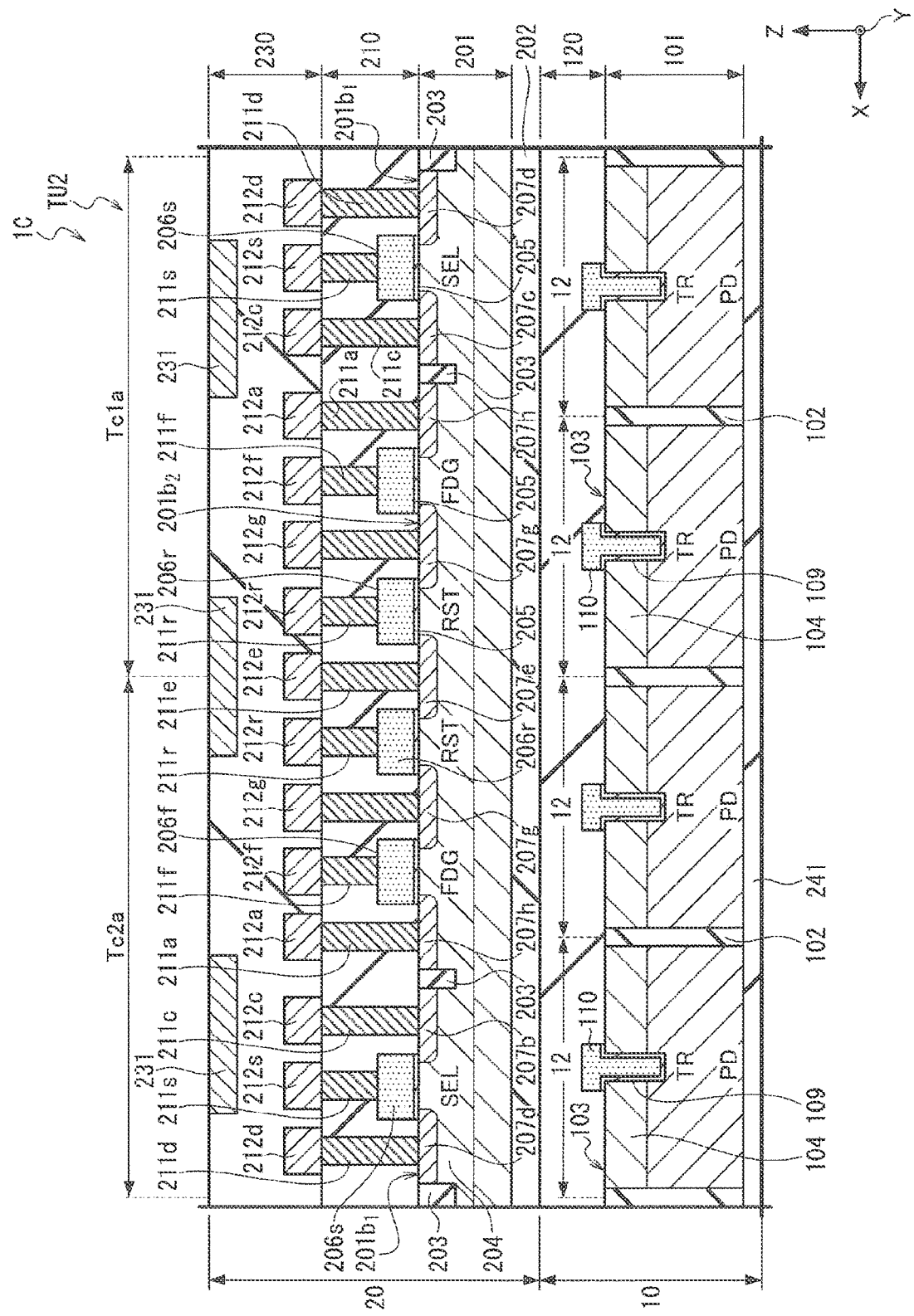
FIG. 16 is a schematic cross-sectional view illustrating a cross-sectional structure taken along line IIIb-IIIb in FIG. 13.

As illustrated in FIGS. 10 to 12, element formation regions (active regions) 201a1, 201b1, and 201b2 defined by an isolation region 203 are provided on the main surface of the semiconductor layer 201 in the transistor cell unit TU2. In addition, the main surface of the semiconductor layer 201 is provided with a feeding region 201c defined by the isolation region 203.

As illustrated in FIG. 10, the element formation region 201a1 extends in the X direction and is individually provided in each of the first and second transistor cells Tc1a and Tc2a. The element formation region 201b1 is adjacent to the element formation region 201a1, extends in the X direction side by side with the element formation region 201a1, and is individually provided in each of the first and second transistor cells Tc1a and Tc2a. The element formation region 201b2 is provided between the two element formation regions 201b1 and 201b1 so as to be adjacent to the element formation region 201a1, and extends over the first transistor cell Tc1a and the second transistor cell Tc2a in the X direction side by side with the element formation region 201a1. The two element formation regions 201b1 and 201b1 and the element formation region 201b2 are arranged in a line at a predetermined interval in the X direction.

The feeding region 201c is provided across the boundary between the first transistor cell Tc1a and the second transistor cell Tc2a between the element formation region 201a1 of the first transistor cell Tc1a and the element formation region 201a1 of the second transistor cell Tc2b. The two element formation regions 201a1 and 201a1 sandwiching the feeding region 201c are arranged in a line at a predetermined interval in the X direction.

The first and second transistor cells Tc1a and Tc2a have an inversion pattern in which the element forming regions 201a1, 201b1, and 201b2 and the feeding region 201c are inverted with the boundary between the first transistor cell Tc1a and the second transistor cell Tc2a as an inversion axis.

In other words, in the first and second transistor cells Tc1a and Tc2a, the element forming regions 201a, 201b1, and 201b2 and the feeding region 201c are linearly symmetric with respect to the boundary between the first transistor cell Tc1a and the second transistor cell Tc2a as a symmetric line.

As illustrated in FIGS. 10 and 11, the amplification transistor AMP (AMP1, AMP2) of each of the first and second transistor cells Tc1a and Tc2a is provided in the corresponding element formation region 201a1. As illustrated in FIGS. 10 and 12, the selection transistor SEL of each of the first and second transistor cells Tc1a and Tc2a is provided in the corresponding element formation region 201b1. The reset transistor RST and the switching transistor FDG of each of the first and second transistor cells Tc1a and Tc2a are connected in series and provided in the element formation region 201b2.

As illustrated in FIGS. 10 and 11, in each of the first and second transistor cells Tc1a and Tc2a, a gate electrode 206a of the amplification transistor AMP is electrically connected to one end of a wire 212a provided on an insulating layer 210 via a contact electrode 211a embedded in the insulating layer 210. The wire 212a is routed such that, in plan view, one end side overlaps the gate electrode 206a of the amplification transistor AMP, the other end side overlaps a main electrode region 207h which is the second main electrode region (source region) of the switching transistor FDG, and an intermediate portion overlaps the contact region 105 and the conductive pad 108 (see FIGS. 4 and 7) of the first substrate section 10.

A main electrode region 207b which is the first main electrode region (drain region) of the amplification transistor AMP is electrically connected to a wire 212b provided on the insulating layer 210 via a contact electrode 211b embedded in the insulating layer 210. The wire 212b is electrically connected to the power supply line VDD.

A main electrode region 207c which is the second main electrode region (source region) of the amplification transistor AMP is electrically connected to a wire 212c provided on the insulating layer 210 via a contact electrode 211c embedded in the insulating layer 210. The wire 212c is routed such that, in plan view, one end side overlaps the main electrode region 207c which is the second main electrode region (source region) of the amplification transistor AMP, and the other end side overlaps the main electrode region 207c which is the first main electrode region (drain region) of the selection transistor SEL.

As illustrated in FIGS. 10 and 12, in each of the first and second transistor cells Tc1a and Tc2a, a gate electrode 206s of the selection transistor SEL is electrically connected to a wire 212s provided on the insulating layer 210 via a contact electrode 211s embedded in the insulating layer 210. The main electrode region 207c which is the first main electrode region (drain region) of the selection transistor SEL is electrically connected to the other end of the wire 212c provided on the insulating layer 210 via a contact electrode 211c embedded in the insulating layer 210. Unlike the above first embodiment, the main electrode region 207c which is the first main electrode region of the selection transistor SEL and the main electrode region 207c which is the second main electrode region of the amplification transistor AMP are not shared. A main electrode region 207d which is the second main electrode region of the selection transistor SEL is electrically connected to a wire 212d provided on the insulating layer 210 via a contact electrode 211d embedded in the insulating layer 210. Although not illustrated in detail, the wire 212d is electrically connected to the vertical signal line 24 (see FIGS. 1 and 2) as in the above first embodiment.

As illustrated in FIGS. 10 and 12, in each of the first and second transistor cells Tc1a and Tc2a, a gate electrode 206r of the reset transistor RST is electrically connected to a wire 212r provided on the insulating layer 210 via a contact electrode 211r embedded in the insulating layer 210. Although not illustrated in detail, the wire 212r is electrically connected to the reset transistor drive line of the pixel drive line 23 (see FIG. 1). A main electrode region 207e which is the first main electrode region (drain region) of the reset transistor RST is electrically connected to a wire 212e provided on the insulating layer 210 via a contact electrode 211e embedded in the insulating layer 210. Although not illustrated in detail, the wire 212e is electrically connected to the power supply line VDD (see FIG. 2).

As illustrated in FIGS. 10 and 12, in each of the first and second transistor cells Tc1a and Tc2a, a gate electrode 206f of the switching transistor FDG is electrically connected to a wire 212f provided on the insulating layer 210 via a contact electrode 211f embedded in the insulating layer 210. The main electrode region 207h which is the second main electrode region (source region region) of the switching transistor FDG is electrically connected to the wire 212a provided on the insulating layer 210 via a contact electrode 211h embedded in the insulating layer 210. The main electrode region 207g which serves as the first main electrode region (drain region) of the switching transistor FDG also serves as the second main electrode region (source region) of the reset transistor RST.

The main electrode region 207g that serves as both the first main electrode region of the switching transistor FDG and the second main electrode region of the reset transistor RST is electrically connected to the wire 212g provided on the insulating layer 210 via a contact electrode embedded in the insulating layer 210. The wire 212g is for applying a load capacitance, and is electrically connected only to the main electrode region 207g.

As illustrated in FIGS. 10 and 11, a contact region 208 is electrically connected to a wire 212j provided on the insulating layer 210 via a contact electrode 211j embedded in the insulating layer 210. Although not illustrated, the wire 212j is electrically connected to a line VSS to which a second reference potential lower than the first reference potential applied to the power supply line VDD is applied, similar to the wire 212j in the above first embodiment.

As illustrated in FIG. 10, in each of the first and second transistor cells Tc1a and Tc2a, the amplification transistor AMP is provided in the element formation region 201a1, the selection transistor SEL is provided in the element formation region 201b1, and the reset transistor RST and the switching transistor FDG are provided in series in the element formation region 201b2. In addition, the first and second transistor cells Tc1a and Tc2a have an inversion pattern in which the arrangement patterns of the transistors (AMP1, SEL1, RST1, FDG1) of the first transistor cell Tc1 and the transistors (AMP2, SEL2, RST2, FDG2) of the second transistor cell Tc2 are inverted with the boundary between the first transistor cell Tc1a and the second transistor cell Tc2a as an inversion axis. In other words, in the first and second transistor cells Tc1a and Tc2a, the arrangement patterns of these transistors (AMP, SEL, RST, FDG) are linearly symmetric with respect to the boundary between the first transistor cell Tc1a and the second transistor cell Tc2a as a symmetric line.

As illustrated in FIGS. 10 and 12, the reset transistor RST (RST1) of the first transistor cell Tc1 and the reset transistor RST (RST2) of the second transistor cell Tc2 are arranged adjacent to each other in the X direction, and the main electrode region 207e which is the first main electrode region of each of the reset transistors RST is shared. In addition, the contact electrode 211e connected to the main electrode region 207e which is the first main electrode region of each of the reset transistors RST is also shared.

Further, the reset transistor RST of the first transistor cell Tc1a and the reset transistor RST of the second transistor cell Tc2a are aligned to be directed in the same direction such that the channel lengths (gate lengths) of the respective RSTs extend to the X direction.

As illustrated in FIG. 10, in the first and second transistor cells Tc1a and Tc2a, the planar patterns of the wire 212a and the wire 212c of the first transistor cell Tc1a and the wire 212a and the wire 212c of the second transistor cell Tc2 are inverted with the boundary between the first transistor cell Tc1a and the second transistor cell Tc2a as an inversion axis. In other words, in the first and second transistor cells Tc1a and Tc2a, the planar patterns of the wires 212a and 212c are linearly symmetric with respect to the boundary between the first transistor cell Tc1a and the second transistor cell Tc2a as a symmetric line. In addition, the patterns of conductive paths electrically connecting the intermediate portions of the wires 212a and the conductive pad 108 are also linearly symmetric with respect to the boundary between the first transistor cell Tc1a and the second transistor cell Tc2a as a symmetric line, as in the above first embodiment. That is, the patterns of the conductive paths electrically connecting the gate electrodes 206a of the amplification transistors AMP and the main electrode regions 207h which are the second main electrode regions of the switching transistors FDG to the contact regions 105 (floating diffusions FD) of the four sensor pixels 12 are linearly symmetric with respect to the boundary between the first transistor cell Tc1a and the second transistor cell Tc2a as a symmetric line. Note that the inversion axis and the symmetric line are not physically formed.

In the solid-state imaging device 1B according to the second embodiment, the sensor pixel 12 and a plurality of transistors (AMP, SEL, FDG, RST) included in the readout circuit 22 are stacked using different substrate sections (10 and 20), as in the above-described first embodiment. Therefore, the plurality of (four in the first embodiment) sensor pixels 12 sharing one readout circuit 22 can easily have the same repetitive structure, and a structure for reducing the optical sensitivity difference can be ensured.

Furthermore, the solid-state imaging device 1B according to the second embodiment includes, for each readout circuit 22, the plurality of transistors (AMP, SEL, FDG, RST) each included in the readout circuit 22, and includes the first and second transistor cells Tc1a and Tc2a arranged adjacent to each other in the X direction in plan view. Further, the reset transistors RST (RST1, RST2) of the first and second transistor cells Tc1a and Tc2a are arranged adjacent to each other in the X direction, and the main electrode region 207e which is the first main electrode region out of the pair of main electrode regions of each of the reset transistors RTS (RST1, RST2) is shared. Therefore, the occupation area occupied by the reset transistor RST (RST1, RST2) in each of the first and second transistor cells Tc1a and Tc2a can be reduced, and the occupation area of the amplification transistor AMP can be increased as the occupation area of the reset transistor RST is reduced. That is, the gate area (gate length Lg×gate width Wg) of the gate electrode 206a of the amplification transistor AMP (AMP1, AMP2) of each of the first and second transistor cells Tc1a and Tc2a can be easily extended without increasing the layout area of the first and second transistor cells Tc1a and Tc2a.

Therefore, according to the solid-state imaging device 1B according to the second embodiment, it is possible to ensure a structure for reducing the optical sensitivity difference, and to reduce noise while suppressing an increase in the layout area of the first and second transistor cells Tc1a and Tc2a (a plurality of transistors) in which the plurality of transistors (AMP, SEL, FDG, RST) is arranged, as in the solid-state imaging device 1A according to the above first embodiment.

Third Embodiment

The third embodiment will describe a configuration for achieving both sharing of the main electrode region 207b which is the first main electrode region of the amplification transistor AMP in the above-described first embodiment and sharing of the main electrode region 207e which is the first main electrode region of the reset transistor RST in the above-described second embodiment.

A solid-state imaging device 1C according to the third embodiment of the present technology basically has a configuration similar to the configuration of the second embodiment described above, but is different from the second embodiment in the following configurations.

That is, as illustrated in FIGS. 13 to 16, element formation regions 201a1 and 201b2 are connected to each other with a connection region 201d defined by the isolation region 203 in the semiconductor layer 201 in the transistor cell unit TU2.

In addition, the feeding region 201c is arranged on the main electrode region 207c side (second main electrode region side) of the amplification transistor AMP (AMP1, AMP2).

Further, the amplification transistor AMP (AMP1) of the first transistor cell Tc1a and the amplification transistor AMP (AMP2) of the second transistor cell Tc2a are arranged to face each other in the X direction, and the main electrode region 207b which is the first main electrode region of each of the amplification transistors AMP (AMP1, AMP2) is shared, as in the above first embodiment.

Further, the reset transistor RST (RST1) of the first transistor cell Tc1a and the reset transistor RST (RST2) of the second transistor cell Tc2a are arranged to face each other in the X direction, and the main electrode region 207e which is the first main electrode region of each of the reset transistors RST (RST1, RST2) is shared, as in the above second embodiment.

In addition, the connection region 201d is provided with a semiconductor region 207m of a conductivity type same as the conductivity type of the main electrode region 207b which is the first main electrode region of the amplification transistor AMP and the main electrode region 207e which is the first main electrode region of the reset transistor RST, the semiconductor region 207m being integrated with both the main electrode regions 207b and 207e. The main electrode region 207b which is the first main electrode region of the amplification transistor AMP and the main electrode region 207e which is the first main electrode region of the reset transistor RST are electrically connected via the semiconductor region 207m and are electrically connected to the power supply line VDD.

Further, the semiconductor region 207m of the connection region 201d, the main electrode region 207b which is the first main electrode region of the amplification transistor AMP, and the main electrode region 207e which is the first main electrode region of the reset transistor RST have a linearly symmetric configuration with respect to the boundary between the first transistor cell Tc1a and the second transistor cell Tc2a as a symmetric line.

The other configurations are substantially similar to those of the second embodiment described above.

According to the solid-state imaging device 1C according to the third embodiment, it is possible to increase the gate area of the amplification transistor AMP (AMP1, AMP2) as compared with the solid-state imaging device 1A according to the first embodiment and the solid-state imaging device 1B according to the second embodiment, and thus, it is possible to further reduce noise while suppressing an increase in the layout area of the first and second transistor cells Tc1 and Tc2 in which the plurality of transistors (AMP, SEL, FDG, RST) is arranged.

Fourth Embodiment

A solid-state imaging device 1D according to the fourth embodiment of the present technology basically has a configuration similar to the configuration of the solid-state imaging device 1A according to the first embodiment described above, but is different from the solid-state imaging device 1A in the configuration of the readout circuit.

Figure 17:
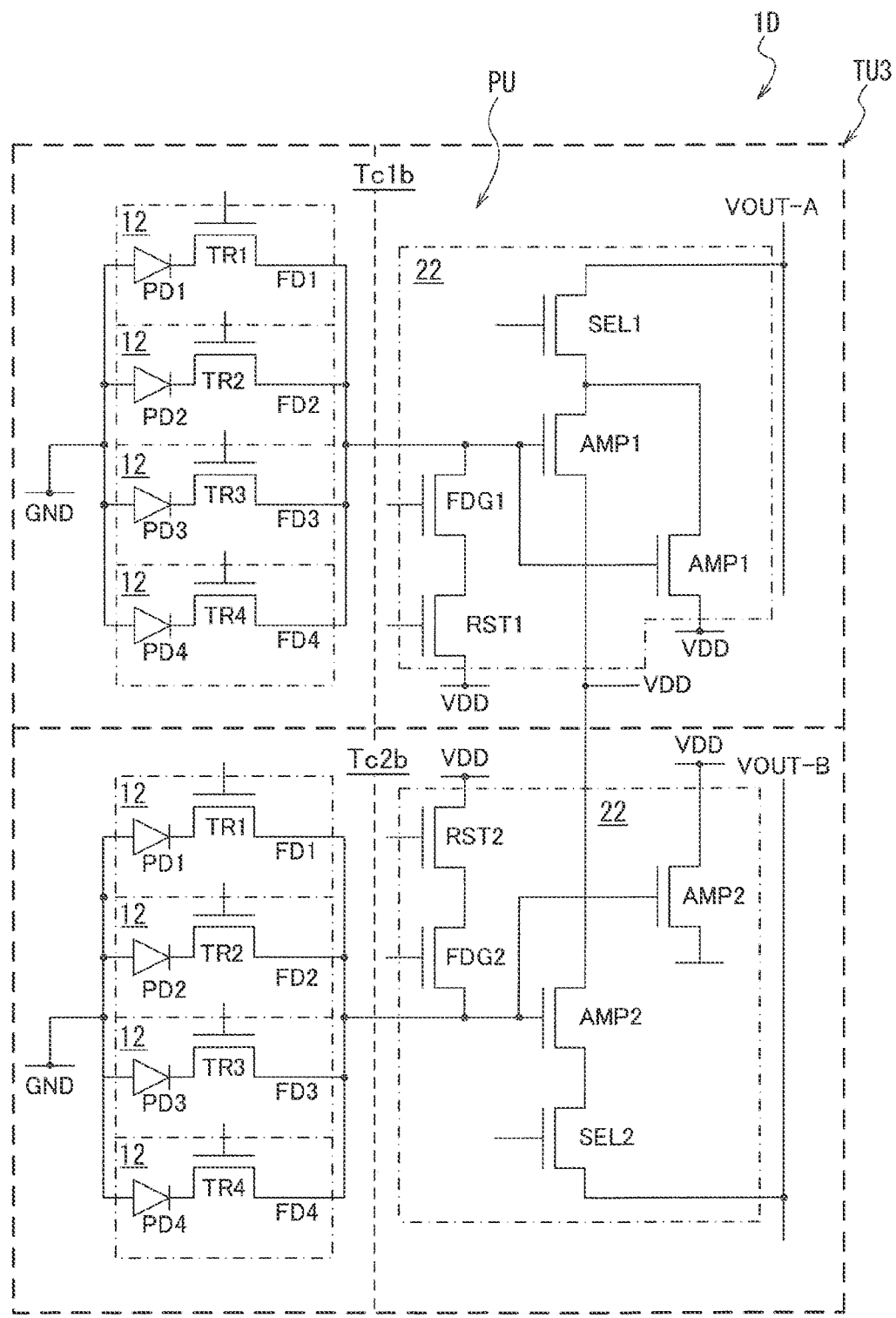
FIG. 17 is an equivalent circuit diagram of a pixel unit mounted on a solid-state imaging device according to a fourth embodiment of the present technology.

That is, as illustrated in FIG. 17, the solid-state imaging device 1D according to the fourth embodiment has a configuration in which the readout circuit 22 includes two amplification transistors AMP connected in parallel. In each of the two amplification transistors AMP, the gate electrode is electrically connected to the source region of the switching transistor FDG and the floating diffusions FD of the four sensor pixels 12, the source region is electrically connected to the drain region of the selection transistor SEL, and the drain region is electrically connected to the power supply line VDD.

Figure 18:
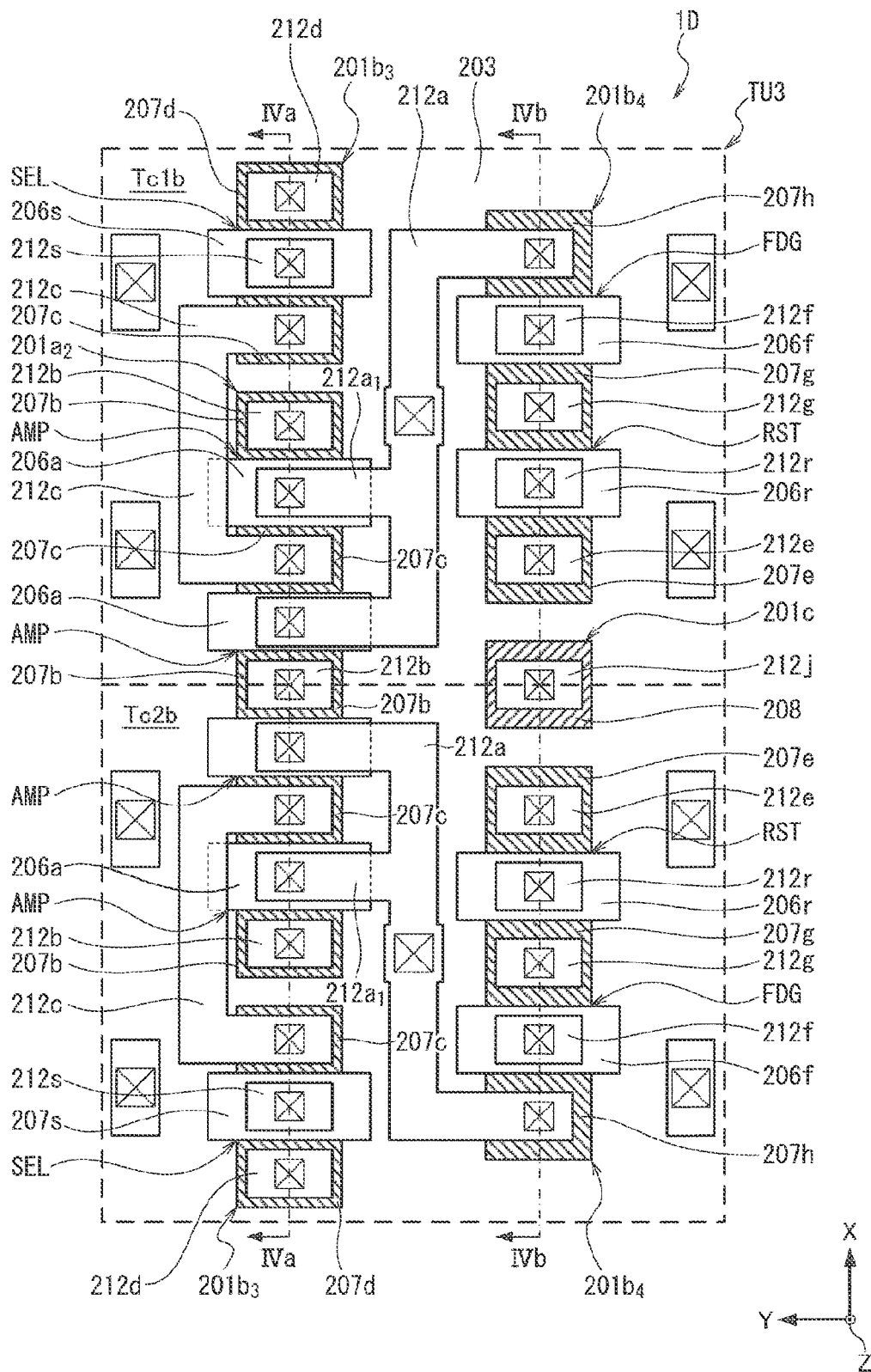
FIG. 18 is a layout plan view of first and second transistor cells mounted on the solid-state imaging device according to the fourth embodiment of the present technology.

As illustrated in FIGS. 17 and 18, the solid-state imaging device 1D according to the fourth embodiment includes a transistor cell unit TU3 instead of the transistor cell unit TU1 of the first embodiment described above.

As illustrated in FIGS. 17 and 18, the transistor cell unit TU3 includes a first transistor cell Tc1b and a second transistor cell Tc2b arranged adjacent to each other in the X direction. Similar to the first and second transistor cells Tc1 and Tc2 in the above first embodiment, the first transistor cell Tc1b and the second transistor cell Tc2b include, for each readout circuit 22, an amplification transistor AMP, a selection transistor SEL, a switching transistor FDG, and a reset transistor RST as a plurality of transistors included in the readout circuit 22, for example. That is, the transistor cell unit TU3 includes two transistor cells (Tc1b and Tc2b) individually corresponding to the two readout circuits 22, and one of the two transistor cells is the first transistor cell Tc1b and the other is the second transistor cell Tc2b. Unlike the first embodiment described above, the readout circuit 22 includes two amplification transistors AMP connected in parallel in the fourth embodiment.

Figure 19:
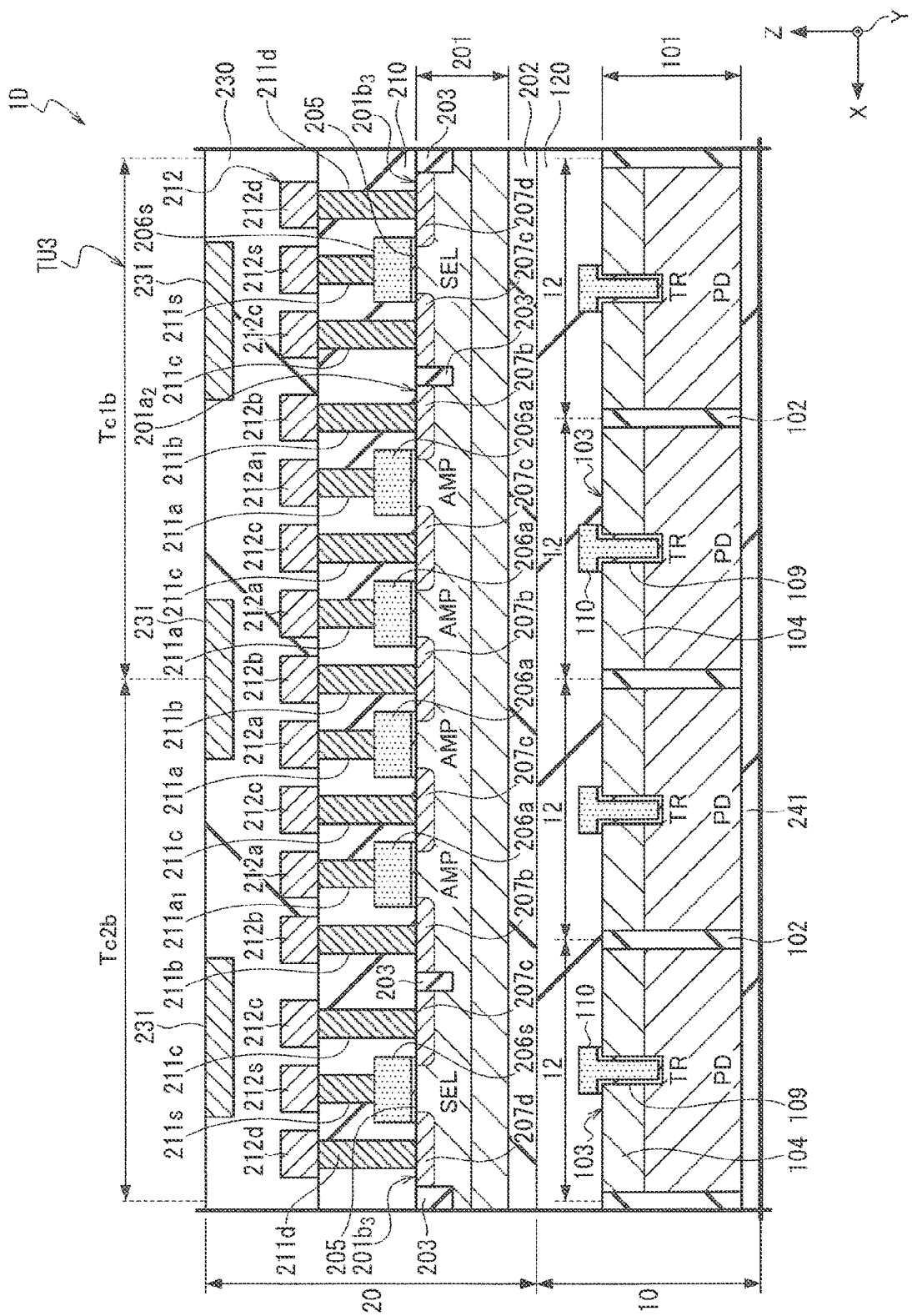
FIG. 19 is a schematic cross-sectional view illustrating a cross-sectional structure taken along line IVa-IVa in FIG. 13.
Figure 20:
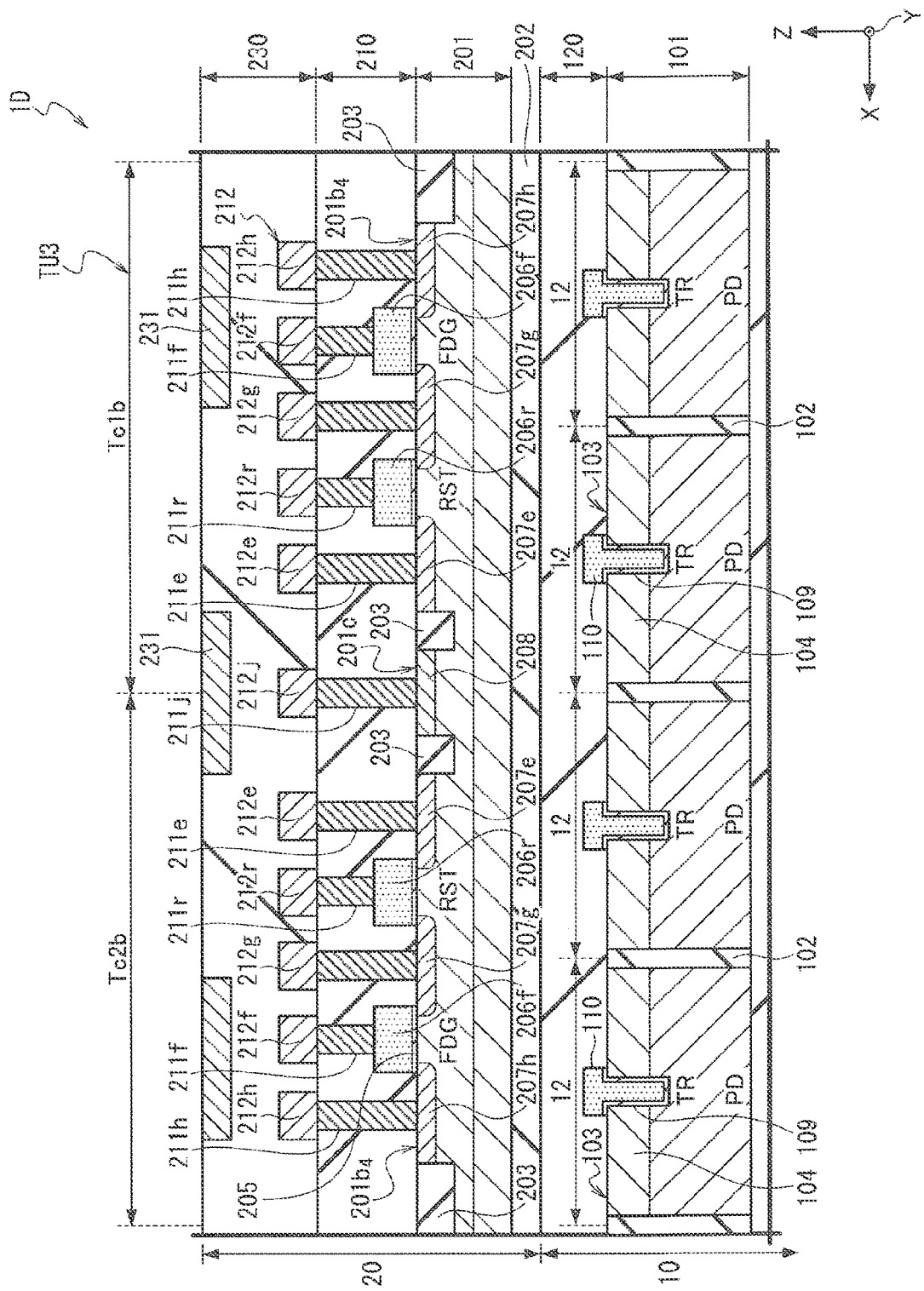
FIG. 20 is a schematic cross-sectional view illustrating a cross-sectional structure taken along line IVb-IVb in FIG. 13.

As illustrated in FIGS. 18 to 20, element formation regions (active regions) 201a2, 201b3, and 201b4 defined by an isolation region 203 are provided on the main surface of a semiconductor layer 201 in the transistor cell unit TU3. In addition, the main surface of the semiconductor layer 201 is provided with a feeding region 201c defined by the isolation region 203.

As illustrated in FIG. 18, the element formation region 201b3 extends in the X direction and is individually provided in each of the first and second transistor cells Tc1b and Tc2b. The element formation region 201a2 extends over the first transistor cell Tc1b and the second transistor cell Tc2b in the X direction between the two element formation regions 201b3 and 201b3. The element formation region 201b4 is adjacent to the element formation regions 201b3 and 201a2, extends in the X direction side by side with the element formation regions 201b3 and 201a2, and is individually provided in each of the first and second transistor cells Tc1b and Tc2b.

The feeding region 201c is provided across the boundary between the first transistor cell Tc1b and the second transistor cell Tc2b between the element formation region 201b4 of the first transistor cell Tc1b and the element formation region 201b4 of the second transistor cell Tc2b. The two element formation regions 201b4 and 201b4 sandwiching the feeding region 201c are arranged in a line at a predetermined interval in the X direction.

The first and second transistor cells Tc1b and Tc2b have an inversion pattern in which the element forming regions 201a2, 201b3, and 201b4 and the feeding region 201c are inverted with a boundary between the first transistor cell Tc1b and the second transistor cell Tc2b as an inversion axis. In other words, in the first and second transistor cells Tc1b and Tc2b, the element forming regions 201a2, 201b3, and 201b4 and the feeding region 201c are linearly symmetric with respect to the boundary between the first transistor cell Tc1b and the second transistor cell Tc2b as a symmetric line.

As illustrated in FIGS. 18 and 19, the two amplification transistors AMP (AMP1, AMP2) of each of the first and second transistor cells Tc1b and Tc2b are provided in the corresponding element formation region 201a2. The selection transistor SEL of each of the first and second transistor cells Tc1a and Tc2a is provided in the corresponding element formation region 201b3. The reset transistor RST and the switching transistor FDG of each of the first and second transistor cells Tc1b and Tc2b are connected in series and provided in the element formation region 201b4.

As illustrated in FIGS. 18 and 19, in each of the first and second transistor cells Tc1b and Tc2b, a gate electrode 206a of one of the two amplification transistors AMP is electrically connected to one end of a wire 212a provided on the insulating layer 210 via a contact electrode 211a embedded in the insulating layer 210. The wire 212a is routed such that, in plan view, one end side overlaps the gate electrode 206a of one of the amplification transistors AMP, the other end side overlaps a main electrode region 207h which is the second main electrode region (source region) of the switching transistor FDG, and an intermediate portion overlaps the conductive pad 108 (see FIGS. 4 and 7) of the first substrate section 10. In addition, in the fourth embodiment, the wire 212a has a branch portion 212a1 that branches and is drawn onto the gate electrode 206a of the other of the two amplification transistors AMP.

A main electrode region 207b which is the first main electrode region (drain region) of one of the amplification transistors AMP is electrically connected to a wire 212b provided on the insulating layer 210 via a contact electrode 211b embedded in the insulating layer 210. The wire 212b is electrically connected to the power supply line VDD. A main electrode region 207c which is the second main electrode region (source region) of the one of the amplification transistors AMP is electrically connected to a wire 212c provided on the insulating layer 210 via a contact electrode 211c embedded in the insulating layer 210. The wire 212c is routed such that, in plan view, one end side overlaps the main electrode region 207c which is the second main electrode region of the one of the amplification transistors AMP, and the other end side overlaps the main electrode region 207c which is the first main electrode region (drain region) of the selection transistor SEL.

In each of the first and second transistor cells Tc1b and Tc2b, the gate electrode 206a of the other of the two amplification transistors AMP is electrically connected to the branch portion 212a1 of the wire 212a provided on the insulating layer 210 via the contact electrode 211a embedded in the insulating layer 210. The main electrode region 207b which is the first main electrode region (drain region) of the other of the amplification transistors AMP is electrically connected to the wire 212b provided on the insulating layer 210 via the contact electrode 211b embedded in the insulating layer 210. The wire 212b is electrically connected to the power supply line VDD. The main electrode region 207c which is the second main electrode region (source region) of the other of the amplification transistors AMP is electrically connected to a wire 212c provided on the insulating layer 210 via a contact electrode 211c embedded in the insulating layer 210. The main electrode region 207c which serves as the second main electrode region of the other of the two amplification transistors AMP also serves as the second main electrode region (source region) of the one of the two amplification transistors AMP.

As illustrated in FIGS. 18 and 19, in each of the first and second transistor cells Tc1b and Tc2b, a gate electrode 206s of the selection transistor SEL is electrically connected to a wire 212s provided on the insulating layer 210 via a contact electrode 211s embedded in the insulating layer 210. The main electrode region 207c which is the first main electrode region (drain region) of the selection transistor SEL is electrically connected to the other end of the wire 212c provided on the insulating layer 210 via a contact electrode 211c embedded in the insulating layer 210. Unlike the above first embodiment, the main electrode region 207c which is the first main electrode region of the selection transistor SEL and the main electrode region 207c which is the second main electrode region of the amplification transistor AMP are not shared. A main electrode region 207d which is the second main electrode region of the selection transistor SEL is electrically connected to a wire 212d provided on the insulating layer 210 via a contact electrode 211d embedded in the insulating layer 210. Although not illustrated in detail, the wire 212d is electrically connected to the vertical signal line 24 (see FIGS. 1 and 2) as in the above first embodiment.

As illustrated in FIGS. 18 and 20, in each of the first and second transistor cells Tc1b and Tc2b, a gate electrode 206r of the reset transistor RST is electrically connected to a wire 212r provided on the insulating layer 210 via a contact electrode 211r embedded in the insulating layer 210. Although not illustrated in detail, the wire 212r is electrically connected to the reset transistor drive line of the pixel drive line 23 (see FIG. 1). A main electrode region 207e which is the first main electrode region (drain region) of the reset transistor RST is electrically connected to a wire 212e provided on the insulating layer 210 via a contact electrode 211e embedded in the insulating layer 210. Although not illustrated in detail, the wire 212e is electrically connected to the power supply line VDD (see FIG. 2).

As illustrated in FIGS. 18 and 20, in each of the first and second transistor cells Tc1b and Tc2b, a gate electrode 206f of the switching transistor FDG is electrically connected to a wire 212f provided on the insulating layer 210 via a contact electrode 211f embedded in the insulating layer 210. The main electrode region 207h which is the second main electrode region (source region region) of the switching transistor FDG is electrically connected to the wire 212a provided on the insulating layer 210 via a contact electrode 211*h* embedded in the insulating layer 210. A main electrode region 207*g* which serves as the first main electrode region (drain region) of the switching transistor FDG also serves as the second main electrode region (source) region of the reset transistor RST.

As illustrated in FIGS. 18 and 20, a contact region 208 is electrically connected to a wire 212*j* provided on the insulating layer 210 via a contact electrode 211*j* embedded in the insulating layer 210. Although not illustrated, the wire 212*j* is electrically connected to a line VSS to which a second reference potential lower than the first reference potential applied to the power supply line VDD is applied, similar to the wire 212*j* in the above first embodiment.

As illustrated in FIG. 18, in each of the first and second transistor cells Tc1*b* and Tc2*b*, the two amplification transistors AMP are provided in parallel with each other in the element formation region 201*a*2, the selection transistor SEL is provided in the element formation region 201*b*3, and the reset transistor RST and the switching transistor FDG are provided in series in the element formation region 201*b*4. In addition, in the first and second transistor cells Tc1*b* and Tc2*b*, the arrangement patterns of the transistors (AMP1, SEL1, RST1, FDG1) of the first transistor cell Tc1*b* and the transistors (AMP2, SEL2, RST2, FDG2) of the second transistor cell Tc2*b* are inverted with the boundary between the first transistor cell Tc1*b* and the second transistor cell Tc2*b* as an inversion axis. In other words, in the first and second transistor cells Tc1*b* and Tc2*b*, the arrangement patterns of these transistors (AMP, SEL, RST, FDG) are linearly symmetric with respect to the boundary between the first transistor cell Tc1*b* and the second transistor cell Tc2*b* as a symmetric line.

As illustrated in FIGS. 18 and 19, the amplification transistor AMP (AMP1) which is one of the two amplification transistors AMP of the first transistor cell Tc1*b* and the amplification transistor AMP (AMP2) which is one of the two amplification transistors AMP of the second transistor cell Tc2*b* are arranged adjacent to each other in the X direction, and the main electrode region 207*b* which is the first main electrode region of each of the amplification transistors AMP is shared. Further, the contact electrode 211*b* connected to the main electrode region 207*b* which is the first main electrode region of each of the amplification transistors AMP is also shared.

Further, the amplification transistor AMP (AMP1) which is one of the two amplification transistors AMP of the first transistor cell Tc1*b* and the amplification transistor AMP (AMP2) which is one of the two amplification transistors AMP of the second transistor cell Tc2*b* are aligned to be directed in the same direction such that the channel lengths (gate lengths) of the respective AMPs extend to the X direction.

As illustrated in FIG. 18, in each of the first and second transistor cells Tc1*b* and Tc2*b*, the planar patterns of the wire 212*a* and the wire 212*c* of the first transistor cell Tc1*b* and the wire 212*a* and the wire 212*c* of the second transistor cell Tc2*b* are inverted with the boundary between the first transistor cell Tc1*b* and the second transistor cell Tc2*b* as an inversion axis. In other words, in the first and second transistor cells Tc1*b* and Tc2*b*, the planar patterns of the wires 212*a* and 212*c* are linearly symmetric with respect to the boundary between the first transistor cell Tc1*a* and the second transistor cell Tc2*a* as a symmetric line. In addition, the patterns of conductive paths electrically connecting the intermediate portions of the wires 212*a* and the conductive pad 108 (see FIG. 7) are also linearly symmetric with respect to the boundary between the first transistor cell Tc1*b* and the second transistor cell Tc2*b* as a symmetric line, as in the above first embodiment. That is, the patterns of the conductive paths electrically connecting the gate electrodes 206*a* of the two amplification transistors AMP and the main electrode regions 207*h* which are the second main electrode regions of the switching transistors FDG to the contact regions 105 (floating diffusions FD) of the four sensor pixels 12 are linearly symmetric with respect to the boundary between the first transistor cell Tc1*b* and the second transistor cell Tc2*b* as a symmetric line. Note that the inversion axis and the symmetric line are not physically formed.

The solid-state imaging device 1D according to the fourth embodiment includes, for each readout circuit 22, the plurality of transistors (AMP, SEL, FDG, RST) each included in the readout circuit 22, and includes the first and second transistor cells Tc1*b* and Tc2*b* arranged adjacent to each other in the X direction in plan view. In addition, the amplification transistor AMP (AMP1) which is one of the two amplification transistors AMP of the first transistor cell Tc1*b* and the amplification transistor AMP (AMP2) which is one of the two amplification transistors AMP of the second transistor cell Tc2*b* are arranged adjacent to each other in the X direction, and the main electrode region 207*b* which is the first main electrode region of each of the amplification transistors AMP is shared. Therefore, the two amplification transistors AMP can be connected in parallel with each other and provided in the transistor cells Tc1*b* and Tc2*b*, respectively, while suppressing an increase in the cell size of each of the first and second transistor cells Tc1*b* and Tc2*b*. Therefore, according to the solid-state imaging device 1D according to the fourth embodiment, it is also possible to ensure a structure for reducing the optical sensitivity difference, and to reduce noise while suppressing an increase in the layout area of the first and second transistor cells Tc1*b* and Tc2*b* (a plurality of transistors) in which the plurality of transistors (AMP, SEL, FDG, RST) is arranged, as in the solid-state imaging device 1A according to the above first embodiment.

Note that, although the fourth embodiment has described the first and second transistor cells having the two amplification transistors AMP connected in parallel, the present technology can also be applied to first and second transistor cells having two or more amplification transistors AMP connected in parallel.

Fifth Embodiment

A solid-state imaging device 1E according to the fifth embodiment of the present technology basically has a configuration similar to the configuration of the solid-state imaging device 1A according to the first embodiment described above, and includes a transistor cell unit TU4 instead of the transistor cell unit TU1 of the first embodiment described above as illustrated in FIGS. 21 and 22. Then, the arrangement of the element formation regions and the feeding region of the semiconductor layer 201 is different. The other configurations are substantially similar to those of the first embodiment described above.

Figure 21:
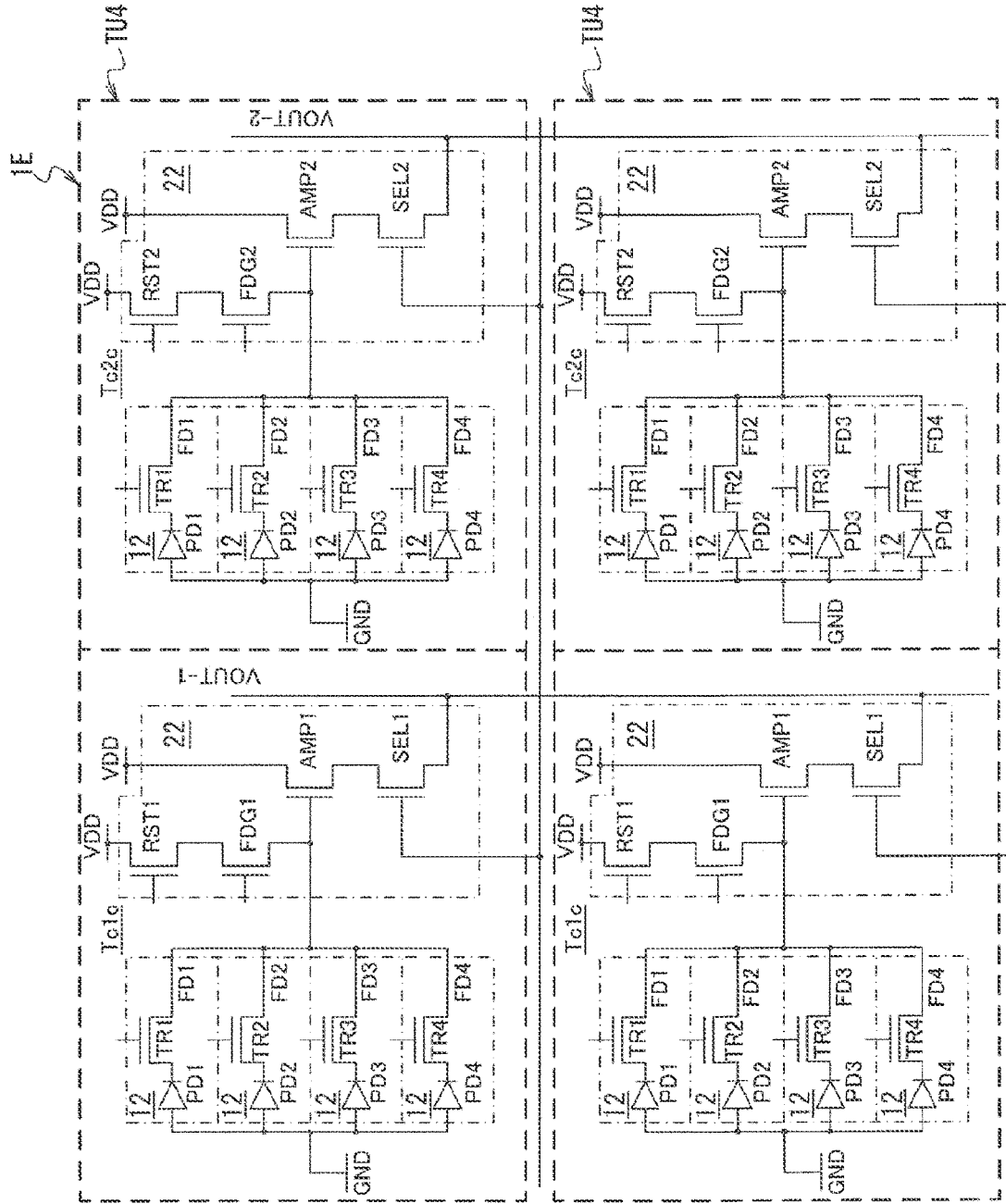
FIG. 21 is an equivalent circuit diagram of a pixel unit mounted on a solid-state imaging device according to a fifth embodiment of the present technology.
Figure 22:
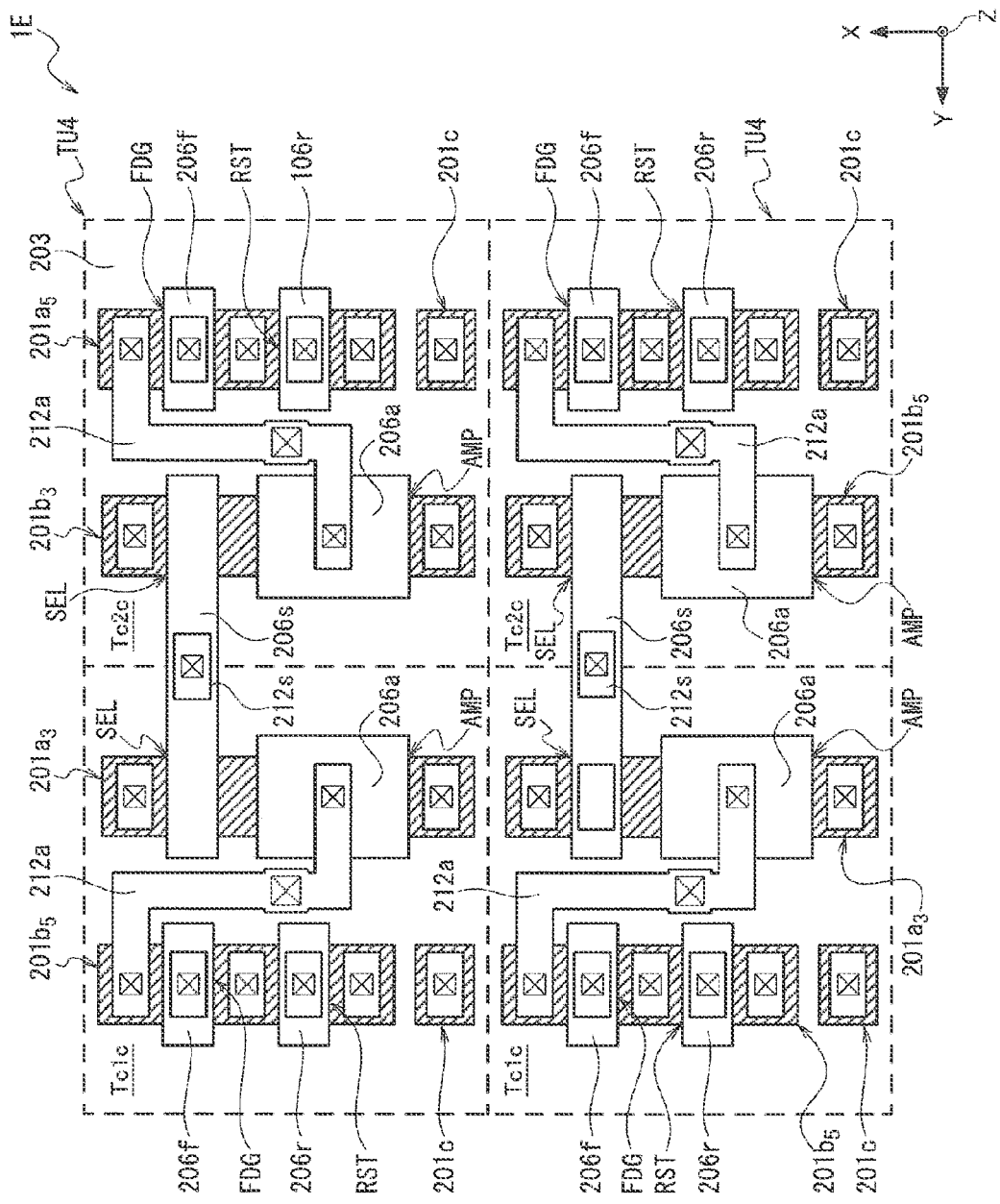
FIG. 22 is a layout plan view of first and second transistor cells mounted on the solid-state imaging device according to the fifth embodiment of the present technology.

As illustrated in FIGS. 21 and 22, the transistor cell unit TU4 includes a first transistor cell Tc1*c* and a second transistor cell Tc2*c* arranged adjacent to each other in the Y direction. Similar to the first and second transistor cells Tc1 and Tc2 in the above first embodiment, the first transistor cell Tc1*c* and the second transistor cell Tc2*c* include, for each readout circuit 22, an amplification transistor AMP, a selection transistor SEL, a switching transistor FDG, and a reset transistor RST as a plurality of transistors included in the readout circuit 22, for example. That is, the transistor cell unit TU4 includes two transistor cells (Tc1c and Tc2c) individually corresponding to the two readout circuits 22, and one of the two transistor cells is the first transistor cell Tc1c and the other is the second transistor cell Tc2c.

As illustrated in FIG. 22, element formation regions (active regions) 201a3 and 201b5 defined by an isolation region 203 are provided on the main surface of a semiconductor layer 201 in the transistor cell unit TU4. In addition, the main surface of the semiconductor layer 201 is provided with a feeding region 201c defined by the isolation region 203.

As illustrated in FIG. 22, the element formation region 201a3 extends in the X direction and is individually provided in each of the first and second transistor cells Tc1c and Tc2c. The element formation region 201b5 is adjacent to the element formation region 201a3, extends in the X direction side by side with the element formation region 201a3, and is individually provided in each of the first and second transistor cells Tc1c and Tc2c. The feeding region 201c is adjacent to the element formation region 201a3, extends in the X direction in the same line with and apart from the element formation region 201b5, and is individually provided in each of the first and second transistor cells Tc1c and Tc2c.

As illustrated in FIG. 22, the amplification transistors AMP (AMP1, AMP2) and the selection transistors SEL of the first and second transistor cells Tc1c and Tc2c are provided in series in the element formation regions 201a3 of the first and second transistor cells Tc1c and Tc2c, respectively. The reset transistor RST and the switching transistor FDG of each of the first and second transistor cells Tc1c and Tc2c are connected in series and provided in the element formation region 201b5.

The first and second transistor cells Tc1c and Tc2c have an inversion pattern in which the element forming regions 201a3 and 201b5 and the feeding region 201c are inverted with a boundary between the first transistor cell Tc1c and the second transistor cell Tc2c as an inversion axis. In other words, in the first and second transistor cells Tc1c and Tc2c, the element forming regions 201a3 and 201b5 and the feeding region 201c are linearly symmetric with respect to the boundary between the first transistor cell Tc1c and the second transistor cell Tc2c as a symmetric line.

As illustrated in FIGS. 21 and 22, the switching transistor FDG has a source region (input end of the readout circuit 22) electrically connected to the floating diffusions FD and a gate electrode of the amplification transistor AMP, and a drain region electrically connected to a source region of the reset transistor RST. Further, a gate electrode of the switching transistor FDG is electrically connected to a switching transistor drive line of the pixel drive line 23 (see FIG. 1).

The reset transistor RST has a source region electrically connected to the drain region of the switching transistor FDG, and a drain region electrically connected to a power line VDD. Further, a gate electrode of the reset transistor RST is electrically connected to a reset transistor drive line of the pixel drive line 23 (see FIG. 1).

The amplification transistor AMP has a source region electrically connected to the drain region of the selection transistor SEL, and the drain region electrically connected to the power supply line VDD. In addition, the gate electrode of the amplification transistor AMP is electrically connected to the source region of the switching transistor FDG and the floating diffusions FD.

The selection transistor SEL has a source region electrically connected to the vertical signal line 24, and the drain region electrically connected to the source region of the amplification transistor AMP. Further, a gate electrode of the selection transistor SEL is electrically connected to a selection transistor drive line of the pixel drive line 23 (see FIG. 1).

As illustrated in FIG. 22, in the first and second transistor cells Tc1c and Tc2c, the arrangement patterns of the transistors (AMP1, SEL1, RST1, FDG1) of the first transistor cell Tc1c and the transistors (AMP2, SEL2, RST2, FDG2) of the second transistor cell Tc2c are inverted with the boundary between the first transistor cell Tc1c and the second transistor cell Tc2c as an inversion axis. In other words, they are linearly symmetric with respect to the boundary between the first transistor cell Tc1c and the second transistor cell Tc2c as a symmetric line.

As illustrated in FIGS. 21 and 22, the selection transistor SEL (SEL1) of the first transistor cell Tc1c and the selection transistor SEL (SEL2) of the second transistor cell Tc2c are arranged adjacent to each other in the Y direction, and a gate electrode 206s of each of the selection transistors SEL is shared. Further, the contact electrode connected to each gate electrode 206s is also shared.

As described above, by sharing the gate electrode 206s of the selection transistor SEL (SEL1) in the first transistor cell Tc1c and the gate electrode 206s of the selection transistor SEL (SEL2) in the second transistor cell Tc2c, the contact electrode and the wire connected to the gate electrode can also be shared, whereby the wiring density can be reduced. Thus, the parasitic capacitance can be reduced.

Sixth Embodiment

A solid-state imaging device 1F according to the sixth embodiment of the present technology basically has a configuration similar to the configuration of the solid-state imaging device 1A according to the first embodiment described above, and includes a transistor cell unit TU5 instead of the transistor cell unit TU1 of the first embodiment described above as illustrated in FIGS. 23 and 24. Then, the arrangement of the element formation regions and the feeding region of the semiconductor layer 201 is different. The other configurations are substantially similar to those of the first embodiment described above.

Figure 23:
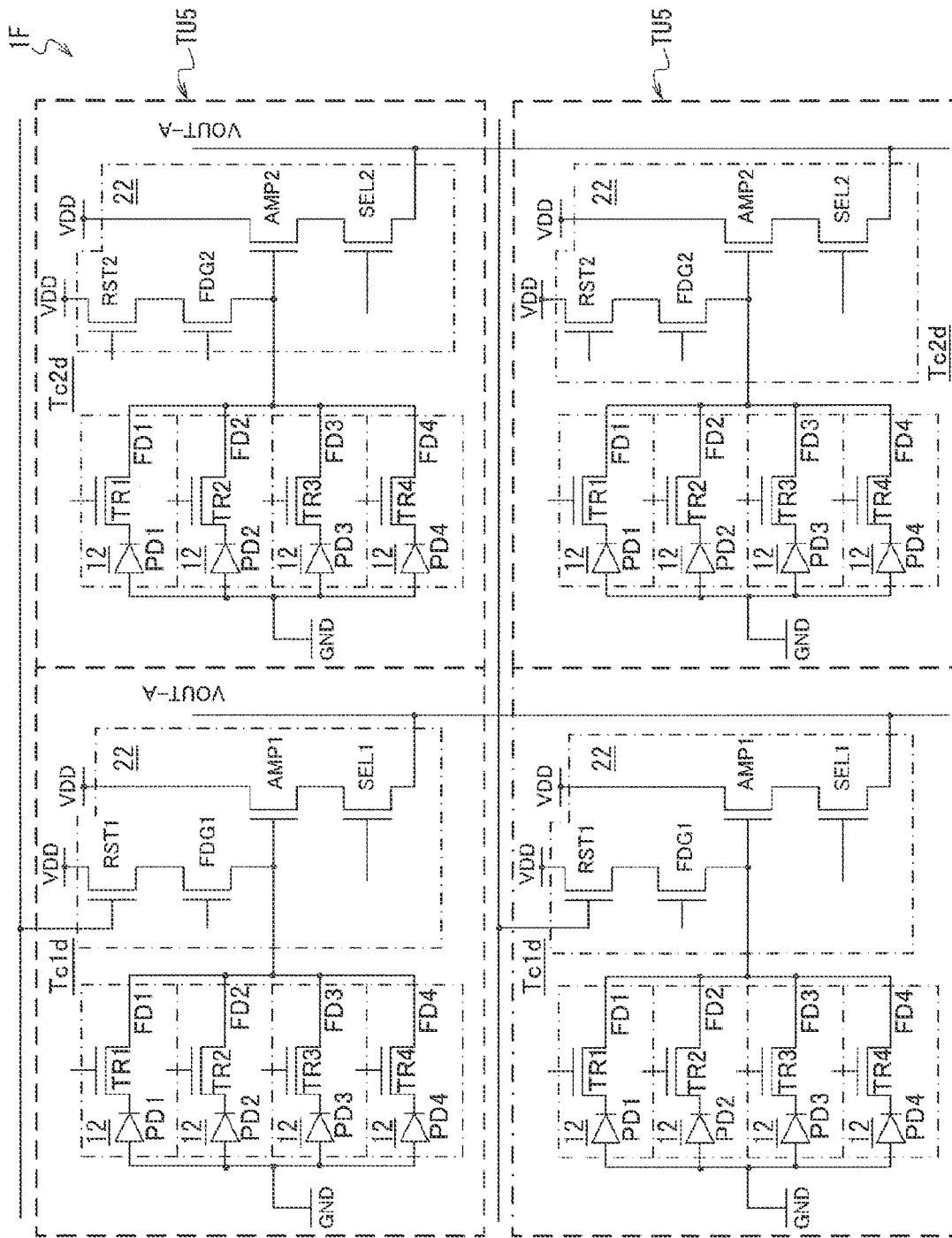
FIG. 23 is an equivalent circuit diagram of a pixel unit mounted on a solid-state imaging device according to a sixth embodiment of the present technology.
Figure 24:
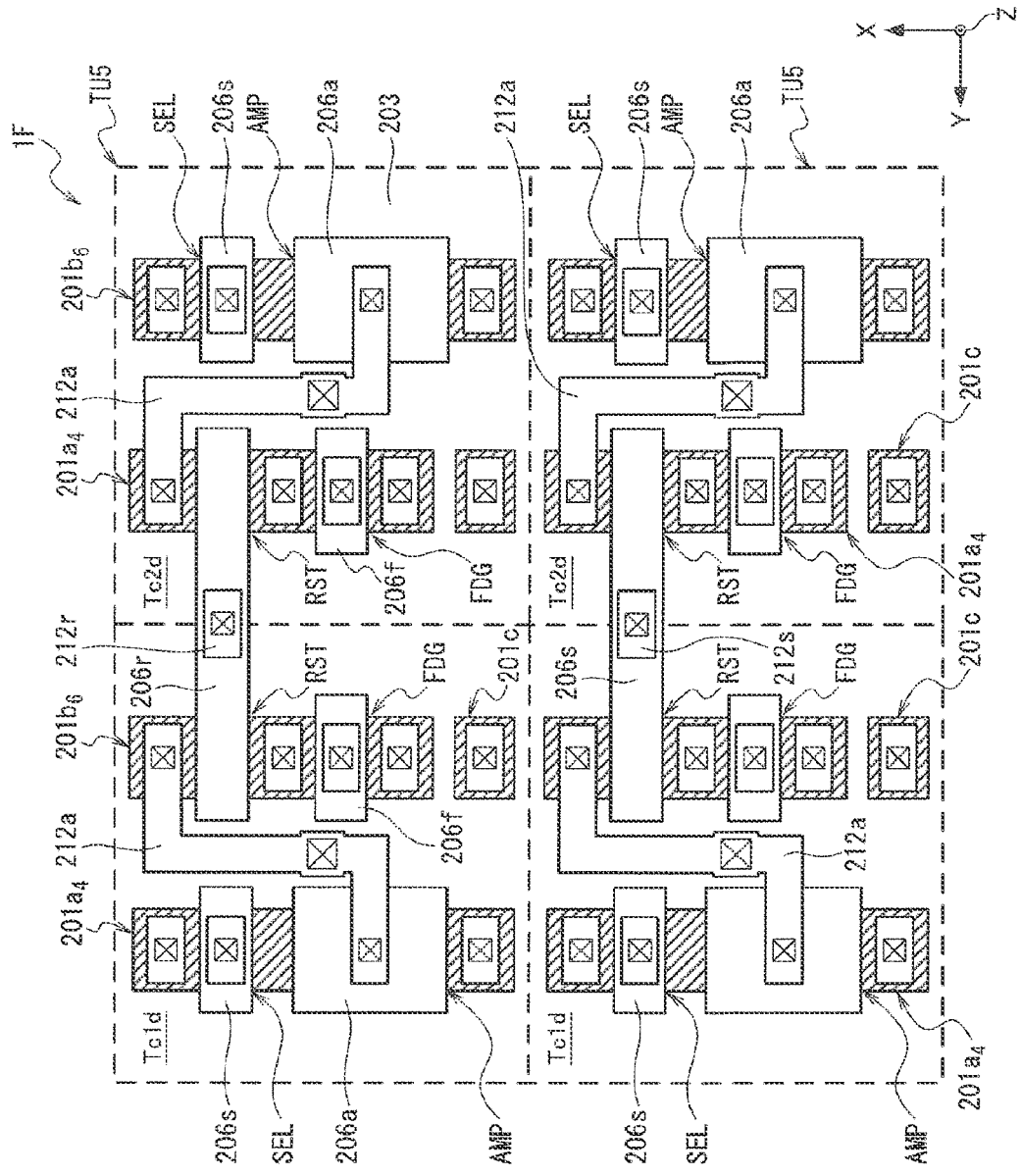
FIG. 24 is a layout plan view of first and second transistor cells mounted on the solid-state imaging device according to the sixth embodiment of the present technology.

As illustrated in FIGS. 23 and 24, the transistor cell unit TU5 includes a first transistor cell Tc1d and a second transistor cell Tc2d arranged adjacent to each other in the Y direction. Similar to the first and second transistor cells Tc1 and Tc2 in the above first embodiment, the first transistor cell Tc1d and the second transistor cell Tc2d include, for each readout circuit 22, an amplification transistor AMP, a selection transistor SEL, a switching transistor FDG, and a reset transistor RST as a plurality of transistors included in the readout circuit 22, for example. That is, the transistor cell unit TU5 includes two transistor cells (Tc1a and Tc2a) individually corresponding to the two readout circuits 22, and one of the two transistor cells is the first transistor cell Tc1d and the other is the second transistor cell Tc2d.

As illustrated in FIG. 24, element formation regions (active regions) 201a4 and 201b5 defined by an isolation region 203 are provided on the main surface of the semiconductor layer 201 (see FIGS. 5 and 6) in the transistor cell unit TU5. In addition, the main surface of the semiconductor layer 201 is provided with a feeding region 201c defined by the isolation region 203.

As illustrated in FIG. 24, the element formation region 201a4 extends in the X direction and is individually provided in each of the first and second transistor cells Tc1d and Tc2*d*. The element formation region 201*b*5 is adjacent to the element formation region 201*a*4, extends in the X direction side by side with the element formation region 201*a*4, and is individually provided in each of the first and second transistor cells Tc1*d* and Tc2*d*. The feeding region 201*c* is adjacent to the element formation region 201*a*4, extends in the X direction in the same line with and apart from the element formation region 201*b*5, and is individually provided in each of the first and second transistor cells Tc1*d* and Tc2*d*.

As illustrated in FIG. 24, the amplification transistors AMP (AMP1, AMP2) and the selection transistors SEL of the first and second transistor cells Tc1*d* and Tc2*d* are provided in series in the element formation regions 201*a*4 of the first and second transistor cells Tc1*d* and Tc2*d*, respectively. The reset transistor RST and the switching transistor FDG of each of the first and second transistor cells Tc1*d* and Tc2*d* are connected in series and provided in the element formation region 201*b*5.

In the first and second transistor cells Tc1*d* and Tc2*d*, the element forming regions 201*a*4 and 201*b*5 and the feeding region 201*c* are inverted with the boundary between the first transistor cell Tc1*d* and the second transistor cell Tc2*d* as an inversion axis. In other words, they are linearly symmetric with respect to the boundary between the first transistor cell Tc1*d* and the second transistor cell Tc2*d* as a symmetric line.

As illustrated in FIGS. 23 and 24, the switching transistor FDG has a source region (input end of the readout circuit 22) electrically connected to the floating diffusions FD and a gate electrode of the amplification transistor AMP, and a drain region electrically connected to a source region of the reset transistor RST. Further, a gate electrode of the switching transistor FDG is electrically connected to a switching transistor drive line of the pixel drive line 23 (see FIG. 1).

The reset transistor RST has a source region electrically connected to the drain region of the switching transistor FDG, and a drain region electrically connected to a power line VDD. Further, a gate electrode of the reset transistor RST is electrically connected to a reset transistor drive line of the pixel drive line 23 (see FIG. 1).

The amplification transistor AMP has a source region electrically connected to the drain region of the selection transistor SEL, and the drain region electrically connected to the power supply line VDD. In addition, the gate electrode of the amplification transistor AMP is electrically connected to the source region of the switching transistor FDG and the floating diffusions FD.

The selection transistor SEL has a source region electrically connected to the vertical signal line 24, and the drain region electrically connected to the source region of the amplification transistor AMP. Further, a gate electrode of the selection transistor SEL is electrically connected to a selection transistor drive line of the pixel drive line 23 (see FIG. 1).

As illustrated in FIG. 24, in the first and second transistor cells Tc1*d* and Tc2*d*, the arrangement patterns of the transistors (AMP1, SEL1, RST1, FDG1) of the first transistor cell Tc1*d* and the transistors (AMP2, SEL2, RST2, FDG2) of the second transistor cell Tc2*d* are inverted with the boundary between the first transistor cell Tc1*d* and the second transistor cell Tc2*d* as an inversion axis. In other words, they are linearly symmetric with respect to the boundary between the first transistor cell Tc1*d* and the second transistor cell Tc2*d* as a symmetric line.

As illustrated in FIGS. 23 and 24, the select transistor RST (RST1) of the first transistor cell Tc1*d* and the select transistor RST (RST2) of the second transistor cell Tc2*d* are arranged adjacent to each other in the Y direction, and the gate electrode 206*r* of each of the select transistors RST is shared. Further, the contact electrode connected to each gate electrode 206*r* is also shared.

As described above, by sharing the gate electrode 206*r* of the select transistor RST (RST1) in the first transistor cell Tc1*c* and the gate electrode 206*r* of the selection transistor RST (RST2) in the second transistor cell Tc2*d*, the contact electrode and the wire connected to the gate electrode 206*r* can also be shared, whereby the wiring density can be reduced. Thus, the parasitic capacitance can be reduced.

It is to be noted that the present technology may also have the following configurations.

(1)

A solid-state imaging device including: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view, in which the plurality of transistors includes amplification transistors, the sensor pixel is provided on the first substrate section, the readout circuit and the first and second transistor cells are provided on the second substrate section, the amplification transistors of the first and second transistor cells are arranged adjacent to each other, and a first main electrode region of a pair of main electrode regions of each of the amplification transistors is shared.

(2)

The solid-state imaging device according to (1), in which a contact electrode connected to the first main electrode region is shared.

(3)

The solid-state imaging device according to (1) or (2), in which the first and second transistor cells have an inversion pattern in which arrangement patterns of the plurality of transistors are inverted with a boundary between the first transistor cell and the second transistor cell as an inversion axis.

(4)

The solid-state imaging device according to any one of (1) to (3), in which the first and second transistor cells are repeatedly arranged in line symmetry in each of the first direction and a second direction orthogonal to the first direction in plan view.

(5)

The solid-state imaging device according to any one of (1) to (4), in which the readout circuit is shared by one or more of the sensor pixels.

(6)

The solid-state imaging device according to any one of (1) to (5), in which the sensor pixel includes a photoelectric conversion element, a transfer transistor electrically regularly connected to the photoelectric conversion element, and a floating diffusion that temporarily holds the electric charge output from the photoelectric conversion element via the transfer transistor, the readout circuit includes: a reset transistor that resets a potential of the floating diffusion unit to a predetermined potential; the amplification transistor that generates, as the pixel signal, a voltage signal corresponding to a level of the electric charge held in the floating diffusion unit; and a selection transistor that controls an output timing of the pixel signal from the amplification transistor.

(7)

The solid-state imaging device according to any one of (1) to (6), in which each of the first and second transistor cells includes two or more of the amplification transistors connected in parallel, and a first main electrode region of any one of the two or more of the amplification transistors in each of the first and second transistor cells is shared.

(8)

A solid-state imaging device including: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view, in which the plurality of transistors includes reset transistors, the sensor pixel is provided on the first substrate section, the readout circuit and the first and second transistor cells are provided on the second substrate section, the reset transistors of the first and second transistor cells are arranged adjacent to each other, and a first main electrode region of a pair of main electrode regions of each of the reset transistors is shared.

(9)

The solid-state imaging device according to (8), in which a contact electrode connected to the first main electrode region is shared.

(10)

The solid-state imaging device according to (8) or (9), in which the first and second transistor cells have an inversion pattern in which arrangement patterns of the plurality of transistors are inverted with a boundary between the first transistor cell and the second transistor cell as an inversion axis.

(11)

The solid-state imaging device according to any one of (8) to (10), in which the first and second transistor cells are repeatedly arranged in line symmetry in each of the first direction and a second direction orthogonal to the first direction in plan view.

(12)

The solid-state imaging device according to any one of (8) to (11), in which the readout circuit is shared by one or more of the sensor pixels.

(13)

The solid-state imaging device according to any one of (8) to (12), in which the sensor pixel includes a photoelectric conversion element, a transfer transistor electrically regularly connected to the photoelectric conversion element, and a floating diffusion that temporarily holds the electric charge output from the photoelectric conversion element via the transfer transistor, the readout circuit includes: a reset transistor that resets a potential of the floating diffusion to a predetermined potential; the amplification transistor that generates, as the pixel signal, a voltage signal corresponding to a level of the electric charge held in the floating diffusion; and a selection transistor that controls an output timing of the pixel signal from the amplification transistor.

(14)

A solid-state imaging device including: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view, in which the plurality of transistors includes amplification transistors and reset transistors, the sensor pixel is provided on the first substrate section, the readout circuit and the first and second transistor cells are provided on the second substrate section, the amplification transistors of the first and second transistor cells are arranged adjacent to each other, and a first main electrode region of a pair of main electrode regions of each of the amplification transistors is shared.

(15)

The solid-state imaging device according to (14), in which a contact electrode connected to the first main electrode region is shared.

(16)

The solid-state imaging device according to (14) or (15), in which the first and second transistor cells have an inversion pattern in which arrangement patterns of the plurality of transistors are inverted with a boundary between the first transistor cell and the second transistor cell as an inversion axis.

(17)

The solid-state imaging device according to any one of (14) to (16), in which the first and second transistor cells are repeatedly arranged in line symmetry in each of the first direction and a second direction orthogonal to the first direction in plan view.

(18)

The solid-state imaging device according to any one of (14) to (17), in which the readout circuit is shared by one or more of the sensor pixels.

(19)

The solid-state imaging device according to any one of (14) to (18), in which the sensor pixel includes a photoelectric conversion element, a transfer transistor electrically regularly connected to the photoelectric conversion element, and a floating diffusion that temporarily holds the electric charge output from the photoelectric conversion element via the transfer transistor, the readout circuit includes: a reset transistor that resets a potential of the floating diffusion to a predetermined potential; the amplification transistor that generates, as the pixel signal, a voltage signal corresponding to a level of the electric charge held in the floating diffusion; and a selection transistor that controls an output timing of the pixel signal from the amplification transistor.

(20)

A solid-state imaging device including: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view, in which the plurality of transistors includes selection transistors, the sensor pixel is provided on the first substrate section, the readout circuit and the first and second transistor cells are provided on the second substrate section, the selection transistors of the first and second transistor cells are arranged adjacent to each other, and a gate electrode of each of the selection transistors is shared.

(21)

The solid-state imaging device according to (20), in which a contact electrode connected to the first main electrode region is shared.

(22)

The solid-state imaging device according to (20) or (21), in which the first and second transistor cells have an inversion pattern in which arrangement patterns of the plurality of transistors are inverted with a boundary between the first transistor cell and the second transistor cell as an inversion axis.

(23)

The solid-state imaging device according to any one of (20) to (22), in which the first and second transistor cells are repeatedly arranged in line symmetry in each of the first direction and a second direction orthogonal to the first direction in plan view.

(24)

The solid-state imaging device according to any one of (20) to (23), in which the readout circuit is shared by one or more of the sensor pixels.

(25)

The solid-state imaging device according to any one of (20) to (24), in which the sensor pixel includes a photoelectric conversion element, a transfer transistor electrically regularly connected to the photoelectric conversion element, and a floating diffusion that temporarily holds the electric charge output from the photoelectric conversion element via the transfer transistor, the readout circuit includes: a reset transistor that resets a potential of the floating diffusion to a predetermined potential; the amplification transistor that generates, as the pixel signal, a voltage signal corresponding to a level of the electric charge held in the floating diffusion; and a selection transistor that controls an output timing of the pixel signal from the amplification transistor.

(26)

A solid-state imaging device including: a first substrate section; a second substrate section disposed on one surface side of the first substrate section; a readout circuit that outputs a pixel signal based on an electric charge output from a sensor pixel that performs photoelectric conversion; and first and second transistor cells each having, for each readout circuit, a plurality of transistors included in the readout circuit, the first and second transistor cells being arranged adjacent to each other in a first direction in plan view, in which the plurality of transistors includes reset transistors, the sensor pixel is provided on the first substrate section, the readout circuit and the first and second transistor cells are provided on the second substrate section, the reset transistors of the first and second transistor cells are arranged adjacent to each other, and a gate electrode of each of the reset transistors is shared.

(27)

The solid-state imaging device according to (26), in which a contact electrode connected to the first main electrode region is shared.

(28)

The solid-state imaging device according to (26) or (27), in which the first and second transistor cells have an inversion pattern in which arrangement patterns of the plurality of transistors are inverted with a boundary between the first transistor cell and the second transistor cell as an inversion axis.

(29)

The solid-state imaging device according to any one of (26) to (28), in which the first and second transistor cells are repeatedly arranged in line symmetry in each of the first direction and a second direction orthogonal to the first direction in plan view.

(30)

The solid-state imaging device according to any one of (26) to (29), in which the readout circuit is shared by one or more of the sensor pixels.

(31)

The solid-state imaging device according to any one of (26) to (30), in which the sensor pixel includes a photoelectric conversion element, a transfer transistor electrically regularly connected to the photoelectric conversion element, and a floating diffusion that temporarily holds the electric charge output from the photoelectric conversion element via the transfer transistor, and the readout circuit includes: a reset transistor that resets a potential of the floating diffusion to a predetermined potential; the amplification transistor that generates, as the pixel signal, a voltage signal corresponding to a level of the electric charge held in the floating diffusion; and a selection transistor that controls an output timing of the pixel signal from the amplification transistor.

The scope of the present technology is not limited to the illustrated and described exemplary embodiments, and includes all embodiments that provide effects equivalent to the effects intended to be provided by the present technology. Furthermore, the scope of the present technology is not limited to the combinations of the features of the invention defined by the claims, and may be defined by any desired combination of specific features among all the recited features.

REFERENCE SIGNS LIST 1A, 1B, 1C, 1D, 1E, 1F Solid-state imaging device
10 First substrate section (first floor section)
12 Sensor pixel
13 Pixel region
20 Second substrate section (second floor section)
22 Readout circuit
23 Pixel drive line
24 Vertical signal line
30 Third substrate section (third floor section)
32 Logic circuit
33 Vertical drive circuit
34 Column signal processing circuit
35 Horizontal drive circuit
36 System control circuit
101 Semiconductor layer
102 Isolation region
103 Island region (element formation region)
104 Well region
105 Contact region
108 Conductive pad
109 Gate insulating film
110 Gate electrode
111 Insulating film
201 Semiconductor layer
202 Insulating film
203 Isolation region
204 Well region
205 Gate insulating film
206a, 206f, 206r, 206s Gate electrode
207b, 207c, 207d, 207e, 207g, 207h Main electrode region
208 Contact region
210 Insulating layer 211a, 211b, 211d, 211e, 211e, 211f, 211g, 211h, 211j, 211m,
211r, 211s Contact electrode
212a, 212b, 212d, 212e, 212e, 212f, 212g, 212h, 212j, 212r,
212s Wire
230 Insulating layer
231 Wire
AMP Amplification transistor
FDG Switching transistor
SEL Selection transistor
RST Reset transistor
TR Transfer transistor

What is claimed is:

1. A solid-state imaging device comprising:
a first substrate section;
a second substrate section disposed on one surface side of the first substrate section;
a readout circuit that outputs a pixel signal based on an electric charge output from a sensor pixel that performs photoelectric conversion; and
first and second transistor cells each having, for each readout circuit, a plurality of transistors included in the readout circuit, the first and second transistor cells being arranged adjacent to each other in a first direction in plan view, wherein
the plurality of transistors includes amplification transistors,
the sensor pixel is provided on the first substrate section,
the readout circuit and the first and second transistor cells are provided on the second substrate section,
the amplification transistors of the first and second transistor cells are arranged adjacent to each other, and a first main electrode region of a pair of main electrode regions of each of the amplification transistors is shared.

2. The solid-state imaging device according to claim 1, wherein a contact electrode connected to the first main electrode region is shared.

3. The solid-state imaging device according to claim 1, wherein the first and second transistor cells have an inversion pattern in which arrangement patterns of the plurality of transistors are inverted with a boundary between the first transistor cell and the second transistor cell as an inversion axis.

4. The solid-state imaging device according to claim 1, wherein the first and second transistor cells are repeatedly arranged in line symmetry in each of the first direction and a second direction orthogonal to the first direction in plan view.

5. The solid-state imaging device according to claim 1, wherein the readout circuit is shared by one or more of the sensor pixels.

6. The solid-state imaging device according to claim 1, wherein
the sensor pixel includes
a photoelectric conversion element,
a transfer transistor electrically regularly connected to the photoelectric conversion element, and
a floating diffusion that temporarily holds the electric charge output from the photoelectric conversion element via the transfer transistor, and
the readout circuit includes:
a reset transistor that resets a potential of the floating diffusion to a predetermined potential;
the amplification transistor that generates, as the pixel signal, a voltage signal corresponding to a level of the electric charge held in the floating diffusion; and
a selection transistor that controls an output timing of the pixel signal from the amplification transistor.

7. The solid-state imaging device according to claim 1, wherein
each of the first and second transistor cells includes two or more of the amplification transistors connected in parallel, and
a first main electrode region of any one of the two or more of the amplification transistors in each of the first and second transistor cells is shared.

8. A solid-state imaging device comprising:
a first substrate section;
a second substrate section disposed on one surface side of the first substrate section;
a readout circuit that outputs a pixel signal based on an electric charge output from a sensor pixel that performs photoelectric conversion; and
first and second transistor cells each having, for each readout circuit, a plurality of transistors included in the readout circuit, the first and second transistor cells being arranged adjacent to each other in a first direction in plan view, wherein
the plurality of transistors includes reset transistors,
the sensor pixel is provided on the first substrate section,
the readout circuit and the first and second transistor cells are provided on the second substrate section,
the reset transistors of the first and second transistor cells are arranged adjacent to each other, and a first main electrode region of a pair of main electrode regions of each of the reset transistors is shared.

9. The solid-state imaging device according to claim 8, wherein a contact electrode connected to the first main electrode region is shared.

10. The solid-state imaging device according to claim 8, wherein the first and second transistor cells have an inversion pattern in which arrangement patterns of the plurality of transistors are inverted with a boundary line between the first transistor cell and the second transistor cell as an inversion axis.

11. The solid-state imaging device according to claim 8, wherein the first and second transistor cells are repeatedly arranged in line symmetry in each of the first direction and a second direction orthogonal to the first direction in plan view.

12. The solid-state imaging device according to claim 8, wherein the readout circuit is shared by one or more of the sensor pixels.

13. The solid-state imaging device according to claim 8, wherein
the sensor pixel includes
a photoelectric conversion element,
a transfer transistor electrically regularly connected to the photoelectric conversion element, and
a floating diffusion that temporarily holds the electric charge output from the photoelectric conversion element via the transfer transistor,
the readout circuit includes:
a reset transistor that resets a potential of the floating diffusion to a predetermined potential;
an amplification transistor that generates, as the pixel signal, a voltage signal corresponding to a level of the electric charge held in the floating diffusion; and
a selection transistor that controls an output timing of the pixel signal from the amplification transistor.

14. A solid-state imaging device comprising:
a first substrate section;
a second substrate section disposed on one surface side of the first substrate section;
a readout circuit that outputs a pixel signal based on an electric charge output from a sensor pixel that performs photoelectric conversion; and
first and second transistor cells each having, for each readout circuit, a plurality of transistors included in the readout circuit, the first and second transistor cells being arranged adjacent to each other in a first direction in plan view, wherein
the plurality of transistors includes amplification transistors and reset transistors,
the sensor pixel is provided on the first substrate section,
the readout circuit and the first and second transistor cells are provided on the second substrate section,
the amplification transistors of the first and second transistor cells are arranged adjacent to each other, and a first main electrode region of a pair of main electrode regions of each of the amplification transistors is shared.

15. The solid-state imaging device according to claim 14, wherein a contact electrode connected to the first main electrode region is shared.

16. The solid-state imaging device according to claim 14, wherein the first and second transistor cells have an inversion pattern in which arrangement patterns of the plurality of transistors are inverted with a boundary line between the first transistor cell and the second transistor cell as an inversion axis.

17. The solid-state imaging device according to claim 14, wherein the first and second transistor cells are repeatedly arranged in line symmetry in each of the first direction and a second direction orthogonal to the first direction in plan view.

18. The solid-state imaging device according to claim 14, wherein the readout circuit is shared by one or more of the sensor pixels.

19. The solid-state imaging device according to claim 14, wherein
the sensor pixel includes
a photoelectric conversion element,
a transfer transistor electrically regularly connected to the photoelectric conversion element, and
a floating diffusion that temporarily holds the electric charge output from the photoelectric conversion element via the transfer transistor, and
the readout circuit includes:
a reset transistor that resets a potential of the floating diffusion to a predetermined potential;
the amplification transistor that generates, as the pixel signal, a voltage signal corresponding to a level of the electric charge held in the floating diffusion; and
a selection transistor that controls an output timing of the pixel signal from the amplification transistor.

* * * * *